US012783744B1

(12) United States Patent
Brooks et al.

(10) Patent No.: US 12,783,744 B1
(45) Date of Patent: Nov. 3, 2026

(54) PROCEDURAL GENERATION OF REALISTIC BUILDINGS FOR SIMULATED WORLDS

(71) Applicant: Zoox, Inc., Foster City, CA (US)

(72) Inventors: Douglas Raymond Brooks, San Mateo, CA (US); Tavershima Gbedda Shande, Burlingame, CA (US)

(73) Assignee: Zoox, Inc., Foster City, CA (US)

( * ) Notice: Subject to any disclaimer, the term of this patent is extended or adjusted under 35 U.S.C. 154(b) by 1169 days.

(21) Appl. No.: 17/723,368

(22) Filed: Apr. 18, 2022

(51) Int. Cl.
*G06F 30/13* (2020.01)
*G06T 17/05* (2011.01)
*G06T 19/20* (2011.01)

(52) U.S. Cl.
CPC .............. *G06F 30/13* (2020.01); *G06T 17/05* (2013.01); *G06T 19/20* (2013.01); *G06T 2219/2004* (2013.01); *G06T 2219/2016* (2013.01); *G06T 2219/2021* (2013.01)

(58) Field of Classification Search
None
See application file for complete search history.

(56) References Cited

U.S. PATENT DOCUMENTS 9,336,618 B1 * 5/2016 Fontaine ................. G06T 11/40
11,783,385 B1 * 10/2023 Khosravan ............. G06Q 30/02
2004/0105573 A1 6/2004 Neumann et al.
2009/0160856 A1 6/2009 Hoguet
2015/0371440 A1 12/2015 Pirchheim et al.
2020/0051327 A1 * 2/2020 Dolan ...................... G06T 17/05
2021/0150442 A1 * 5/2021 Benjamin .............. G06Q 10/06
2021/0343073 A1 * 11/2021 Carrington .............. G06T 17/00
2022/0269888 A1 * 8/2022 Stoeva ...................... G06K 9/00
2022/0309201 A1 9/2022 Yang et al.
2022/0335172 A1 * 10/2022 Ho .......................... G06F 30/13

OTHER PUBLICATIONS

Tutenel, Tim, Ruben M. Smelik, Ricardo Lopes, Klaas Jan de Kraker, and Rafael Bidarra. "Generating consistent buildings: a semantic approach for integrating procedural techniques." IEEE Transactions on Computational Intelligence and AI in Games 3, No. 3 (2011): 274-288. (Year: 2011).*

(Continued)

*Primary Examiner* — Rehana Perveen
*Assistant Examiner* — Kyle H Tseng
(74) *Attorney, Agent, or Firm* — Lee & Hayes, P.C.

(57) ABSTRACT

Techniques for procedurally generating virtual representations of buildings within a simulated environment using building segments from artist-rendered facades are described. The facades are input into the system and the techniques provide for dividing the facade into building segments based on features of the facade. The building segments are assigned rules for assembling the building sections together to populate a virtual building. The rules are manipulable to change possible locations and orientations for the building sections. The building sections are procedurally placed within a building frame according to the rules and the virtual building placed within a simulated driving environment for testing one or more vehicle systems.

15 Claims, 9 Drawing Sheets

(56) References Cited

OTHER PUBLICATIONS

Tutenel, Tim, Rafael Bidarra, Ruben M. Smelik, and Klaas Jan De Kraker. “Rule-based layout solving and its application to procedural interior generation.” In CASA workshop on 3D advanced media in gaming and simulation. 2009. (Year: 2009).*

Office Action for U.S. Appl. No. 17/723,387, Dated Jul. 2, 2025, Brooks, “Systems and Tools for Procedural Generation of Realistic Buildings for Simulated Worlds,” 32 pages.

Office Action for U.S. Appl. No. 17/723,387, Dated Feb. 12, 2026, 45 pages.

* cited by examiner

PROCEDURAL GENERATION OF REALISTIC BUILDINGS FOR SIMULATED WORLDS

BACKGROUND

Simulated-world environments ("simulated environments") comprise three-dimensional geometries of various environments. Such geometries may include, for example, roads, vehicles, pedestrians, and the like. Simulated environments can be useful for enhancing training, testing, and/or validating systems.

BRIEF DESCRIPTION OF THE DRAWINGS

The detailed description is described with reference to the accompanying figures. The use of the same reference numbers in different figures indicates similar or identical components or features.

DETAILED DESCRIPTION

Figure 1:
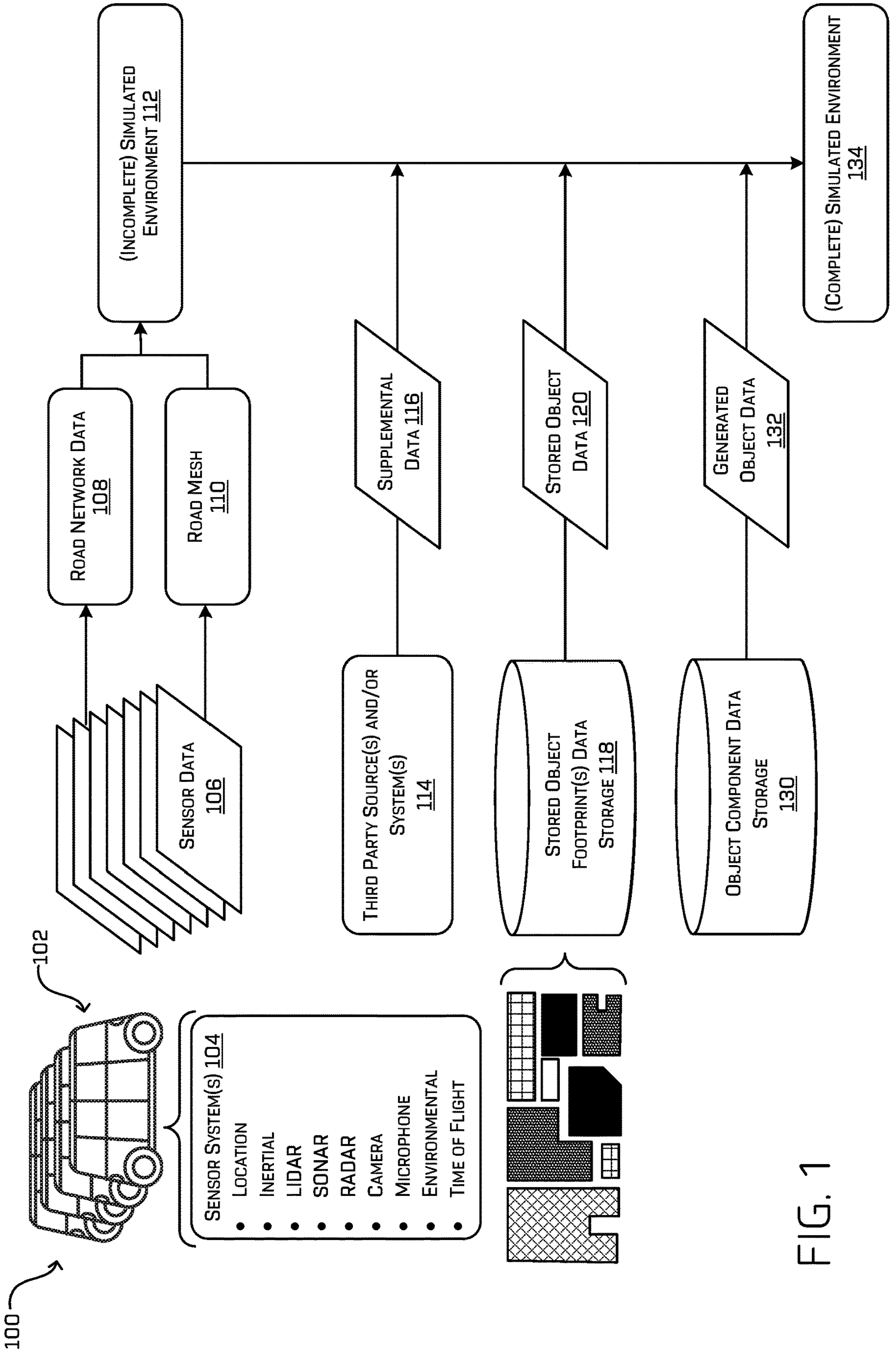
FIG. 1 illustrates an example of procedurally generating a building for a simulated environment, as described herein.

Techniques described herein are directed to various aspects of procedural world generation and more specifically to procedural generation of virtual buildings having realistic appearances (e.g., appearing as buildings that could appear in a real-world physical environment). That is, techniques described herein are directed to procedurally generating simulated buildings and worlds for use with testing, validating, or training systems and/or components used by vehicles for navigating, planning, and/or decision making. In at least some examples described herein, such generated buildings may be populated within road network data to generate a simulated world to accurately represent a real world-environment. Techniques described herein include generating such simulated environments. Though described herein with reference to simulations and testing of vehicle systems in a simulated environment, the techniques described herein may be used for procedural generation of various types of virtual assets within virtual environments. The virtual assets may include buildings, objects, and features that may be included within a virtual environment and may be produced according to the techniques described herein.

In an example, techniques described herein are directed to receiving sensor data from various sensor systems in a physical environment (e.g., real-world physical environment rather than a virtual or computer-generated environment). The sensor systems can include, but are not limited to, light detection and ranging (LiDAR) sensors, radio detection and ranging (RADAR) sensors, ultrasonic transducers, sound navigation and ranging (SONAR) sensors, Time of Flight (ToF) sensors, location sensors (e.g., global positioning system (GPS), compass, etc.), inertial sensors (e.g., inertial measurement units, accelerometers, magnetometers, gyroscopes, etc.), cameras (e.g., RGB, IR, intensity, depth, etc.), wheel encoders, microphones, environment sensors (e.g., temperature sensors, humidity sensors, light sensors, pressure sensors, etc.), etc. Using the sensor data, techniques described herein can generate, receive, and/or otherwise access road network data associated with the real environment and a road mesh associated with the real environment. Techniques described herein can associate the road network data with the road mesh to generate a simulated environment. That is, data representative of a real environment can be used to generate a simulated environment. In some examples, the simulated environment can be supplemented with tertiary data (e.g., data from a third-party), which can be referred to herein as "supplemental data." Techniques descried herein are further directed to procedurally generating buildings and objects to populate in and around the road mesh to form a simulated environment. The resulting simulated environment can be used for testing, validating, and/or training systems and/or components used by an autonomous robotic computing device, such as an autonomous vehicle, for navigating, planning, and/or decision making.

In the example, the virtual buildings are generated to fit within the simulated environment using building segments to procedurally generate a realistic appearing building that may be placed within the simulated environment. A virtual building within the simulated environment may have the same or similar dimensions to a corresponding real-world building in the environment, and may have a realistic appearance, though the realistic appearance may differ from the appearance of the real-world building at the corresponding location. The realistic appearance may be the result of procedurally generating the virtual building from building segments derived from artist-generated or otherwise produced building sheets representing exterior appearances of buildings. Procedural generation enables the creation of numerous variations of realistic looking buildings having different sizes, shapes, and dimensions, from a set of building segments derived from the generated building sheets. Procedural generation includes generation of an object or environment using one or more algorithms rather than purely manual approaches. Procedural generation combines human-generated assets and rule sets and/or algorithms to produce a final product (e.g., a virtual building). The procedural generation described herein can begin with the building sheets described above, that may include one or more architectural features that can be included with a virtual building. In some examples, the building sheets may be representations of real-world buildings or may be entirely fabricated without a real-world reference.

The building sheet used to generate the virtual building can be segmented into building segments. The building sheet and/or the segments of the building sheet can be stretched or shrunk in one or more dimensions to produce segments having different proportions and/or shapes and sizes. Each of the building segments may have one or more architectural features. For example, building segments may include a single feature such as a window, molding, wall section, door, stairs, balcony, light post, flagpole, mailbox, water tower and tank, solar panel, and other such elements. Additionally, the building segments may have variable materials and colors that change the appearance of the segments, in addition to fixture locations where one or more accessories or features (such as a mailbox, flagpole, awning, or other such attachment) may connect to the segments. The various features may be combined with different building segments, for example with a single building segment capable of having a doorway or window connected to it to produce different final results. Additionally, the features may be applied in different scenarios, such as a flagpole that stands vertically from a roof or horizontally from a balcony, or at an angle from a ground floor wall segment. The features may be applied in different locations, such as an awning that can be placed directly above a window or doorway or at a variable height above the doorway or window. In some examples, the building segments may include multiple architectural features, for example with a first segment including a window and surrounding wall portions around the edges of the window, a building entryway with stairs, doors, doorframes, etc. The building sheet can be divided into these segments by a manual or automated procedure to generate building blocks useful for generating myriad virtual buildings. The building sheet may be divided by an individual using a computer tool to select various building segments. In some examples, architectural features may be identified within the building sheet using an algorithm, such as an image or pattern recognition machine learning algorithm trained using labeled architectural feature data. The algorithms may segment the building sheets to the individual features and/or into building segments having multiple features as described herein. In some examples, the algorithms for dividing the building sheets may identify edges, lines, boundaries, or other such divisions between features, and divide the segments according to the identified boundaries.

The building sheet can be divided into different classes of building segments. The classes include building segments for a corner of a building, a repeating or tileable segment, and a repeating segment. In some examples additional classes may be used for the building segments. The different classes of building segments may be used to identify locations and aid in procedural generation of a building using the building segments as described herein.

In some examples, the building sheet can be divided into segments through a user specified process. The process can include identifying particular cut lines for dividing into segments in some examples. In some examples, the process can include identifying architectural features or fixtures and then enabling a semi or fully automated process to segment based on the feature identification. For example, a user may specify that a particular feature is a balcony. An automated process may extract the balcony from the building sheet by identifying an edge or boundary for the balcony and then removing the balcony as a separate item for storage. The balcony may then be placed in a generated building where a balcony may be needed based on the user-identification of the item as a balcony.

After dividing the building sheet into the building segments, the building segments may be annotated with various rules, limitations, and features that describe possible applications for the building segments within a virtual building. For example, the rules may describe a portion of the building where the segment may exist (e.g., first floor, top floor, corner, edge, etc.). The rules may also describe how the building segments may be morphed and/or adjusted to fit particular geometry (e.g., how to scale or stretch the segments in one or more dimensions to fit a particular dimension of a building). The rules may also describe how the building segment may be applied relative to surrounding building segments, for example to describe whether the segment may be tiled in a vertical and/or horizontal direction, what categories or types of building segments may be adjacent, and what building segments or features may be applied to the building segment (e.g., describing a location where a flagpole may be attached to a building entrance segment). The rules can describe different identities of sections that can be combined together and/or adjacent one another. The rules can describe types of buildings that the different sections can be applied to (e.g., industrial, residential, or commercial or even at a more granular level such as an office building, apartment building, school, fire station, etc.). The rules can further describe sides on the buildings where the sections can be applied, such as on a south side of a building only. The rules can further define limits on the amount the sections can be transformed, such as limits on stretching or shrinking the proportions of the sections. The rules can also describe whether a section can be applied generally to an intermediate floor of a building, a particular floor (e.g., a first or second floor), to a multistory building, to a single story building, and can also describe percentage mixes of different types of sections, for example to define particular mixes of types of windows that may be used in a building. The ratios may define the maximum number of different types of a particular feature that may be applied (e.g., to limit to no more than three different window styles in a single building).

The annotations may be performed in a manual, semi-automated, or automated process. In a manual process, a user may select a rule from a set of pre-defined rules, or define a new rule describing one or more characteristics or limitations for applying the segment within a virtual building, and may select a location on the building segment to apply the rule. The manual process may also include copying and duplicating one or more rules either on the same building segment, or across different building segments. In the semi-automated process, one or more algorithms may identify a feature of the building segment (e.g., a door, building corner, roofline, etc.) and may select one or more rules associated with the identified building feature. The user may then apply the one or more rules or may approve application of the rules as identified by the system. In the automated process, rather than the user applying the identified rules, one or more algorithms, including the feature identification algorithm, may identify rules associated with the identified features and may automatically apply the rules to the building segment, which may later be revised and changed by a user. Automatic application of the rules may be based on heuristics from previously generated rules applied to similar building segments. In some examples, the rules may be automatically applied using a machine learning model trained using training data comprising building segments labeled with building segment types and rules applied to the building segments.

During a procedural generation process of a simulated environment, data describing the environment may be accessed for populating with virtual buildings. The data may include entirely fictitious data or may include real-world data derived from one or more sensors of a vehicle system, for example, or any combination thereof. In examples, the data may include a mesh or network of roads, sidewalks, etc. The data may also include a footprint and/or dimensions for buildings within the mesh of road data. The footprint may be gathered from map data or estimated from sensor data (e.g., cameras, LiDARs, radars, etc.). The buildings may be identified within the data and the dimensions may be used as inputs for the procedural generation process. In some examples, the mesh data for the road network may not include the building footprints, but such information may be accessed from a third-party database, for example to access building sizes and dimensions from a database describing building sizes at particular real-world locations. The dimensions of the buildings may be input into a procedural generation algorithm that selects building segments to populate the virtual building according to the shape and dimensions of the building. The building segments can be selected according to the rules, for example with particular rules defining building segments to be applied at a ground floor, or along a building corner. The building segments and features can be assembled according to the applied rules, thereby generating through an automated process, a virtual building having a realistic appearance that can be placed within the road network mesh to create a simulated environment. In examples, the vehicle footprints/dimensions can be generated randomized rules to make a large number of pseudo randomized buildings to represent, for example, a geographical area or urban/suburban setting.

In one example, the building may be procedurally generated based on dimensions of the building provided into a procedural generation tool. During the procedural generation process, the splines of a building are defined based on the building dimensions, the splines defining edges of the building shape. After identifying the splines of the building, corner building segments are identified. The corner building segments are identified based on the classes of the building segments as well as the applied annotations. For example, a building segment identified as a corner building segment with an annotation indicating it is for use on a ground floor of a building may be placed at a ground floor corner location. Additional building segments are placed based on the annotations, which may include the classes of the building segments, for example to continue with a corner building segment annotated to be positioned at a roof of the building. After placing the corner building segments, the building segments to fit between the corners are selected based on a length of the spline extending between the corners. Tileable building segments, (e.g., building segments annotated as tileable along the direction of the building spline to be populated), are placed along the spline between the corners. The tileable elements are placed in a repeating manner to fill the space between the corner building segments. To avoid scaling or stretching the tiles (which may result in changes to the sizes and shapes of the pixels in the textures of the tiles and cause an unrealistic appearance for the scaled tiles), the tiles are duplicated across the spline until a tile can no longer fit in the available space along the spline. At that point, the remaining gap may be filled by a tile that is specifically designed and meant to be scaled in different directions without resulting in an unrealistic appearance (e.g., a spacer tile having fewer textural elements). Any remaining gaps or spaces may be filled using a different building segment annotated as a spacer, such as an architectural detail or scalable element that may be expanded or shrunk to fill the gap remaining along the spline. In this manner, the tileable building segments need not be stretched or scaled and can maintain their realistic appearance. After populating the segments along the splines, the space between the splines (that form a frame around the edge of the building) may be filled using building segments annotated to be placed on a face of a building and to be tileable across the center surface of the building side.

Simulated environments can be useful for enhancing training, testing, and/or validating systems (e.g., one or more components of an artificial intelligent (AI) stack) onboard an autonomous vehicle. For instance, in at least one example, simulated environments can be useful for training systems that are to be used onboard an autonomous vehicle (e.g., models used by such systems), for instance when real data is not readily available, when testing would be unsafe in a real environment, and in order to generate magnitudes more data than would otherwise be available. In at least one example, simulated environments can be used for generating training data for rare or infrequently occurring scenarios and/or objects. Moreover, simulated environments can be useful for testing performance of an autonomous vehicle (e.g., models and/or systems running thereon), for instance, when real environments are either not available or are not safe, or a ground truth is not otherwise available. Furthermore, in some examples, sensor data associated with simulated environments can be more accurate than sensor data associated real environments (e.g., due to occlusions, noise, drift, etc.) and as such, simulated environments can be used for validating observations made in association with real environments. In some examples, simulated environments can be used for calibration (e.g., of one or more sensor systems onboard an autonomous vehicle). Techniques described herein are directed to generating simulated environments and using simulated environments in various scenarios.

Techniques described herein offer various computational efficiencies. For instance, by utilizing procedural generation techniques described herein, simulated worlds can be generated faster than what is available via conventional techniques. Conventional techniques may not be scalable. For instance, generating a simulated environment for a new geographical location can take days, or even months, using conventional techniques. Generating tens, hundreds, and thousands of new simulated environments—as many as are needed for training, testing, and/or validating systems (e.g., one or more components of an AI stack) onboard an autonomous vehicle (e.g., prior to such autonomous vehicle(s) being deployed in corresponding new real environments)—would take months, or even years, thereby limiting the ability to train, test, and/or validate such systems (e.g., one or more components of an AI stack) onboard an autonomous vehicle prior to entering into new real environments. Furthermore, the techniques described herein enable rapid generation of new environments by simply adjusting one or more rules and or maps, for example when a new city layout is defined using road data, the simulated world may be rapidly generated automatically according to the techniques described herein. Additionally, the techniques described herein provide for rapid generation of realistic simulated environments, which procedural generation systems that do not implement the building segments and rules as described herein, may not be capable of producing. For instance, the use of the building sheets for the template buildings enable realistic looking buildings whereas a typical procedurally generated building may result in randomness in the final buildings that causes the end result to look unrealistic for one or more reasons, such as misapplication of features in a generated building or improperly located features. Techniques described herein are unconventional in that they can leverage sensor data collected from real environments and supplement that data with building segments used to produce virtual buildings within the environment, the virtual buildings having realistic appearances and being of a similar or identical size, shape, and/or location to buildings experienced in the real environment. In this manner, techniques described herein can generate a substantially accurate simulated environment (e.g., relative to the corresponding real environment) more efficiently than what is available with conventional techniques. Further, techniques described herein—such as customizing the look of a simulated environment by randomizing and/or parameterizing the addition of object and/or surface details—enable the generation of large, scalable simulated environments in less time and with fewer computational resources than what is available with conventional techniques. Further still, the techniques described herein enable use of different data sources to generate a simulated world without having to adjust or regenerate the simulated buildings through a manual process. Instead, the process described herein enables use of various data sources, such as road data and building data, to generate simulated world and ensure alignment of the buildings with the road data, even as the road data is updated over time.

Furthermore, techniques described herein can be directed to improvements in safety. That is, simulated environments resulting from generation techniques described herein can be used for testing, training, and validating systems onboard an autonomous vehicle to ensure such systems can operate autonomous vehicles safely when deployed in real environments. That is, simulated environments resulting from generation techniques described herein can be used for testing, training, and validating a planner system, which can be used by an autonomous vehicle to navigate the autonomous vehicle along a trajectory in a real environment. Thus, such training, testing, and validating enabled by techniques described herein can provide opportunities to ensure that autonomous vehicles can operate in real world environments safely. As such, techniques described herein improve safety and impact navigation.

FIG. 1 illustrates a schematic diagram 100 representing procedural world generation as described herein. In an example, one or more computing devices can procedurally generate a simulated environment, as described herein. For example, a computing device as described with respect to FIG. 9 may be used to perform some or all of the techniques shown and described with respect to FIG. 1.

In at least one example, data collection devices 102, such as included on a vehicle system, can utilize sensor system(s) 104 to collect sensor data 106 associated with a real environment. As described herein, the sensor system(s) 104 can include, but are not limited to, LIDAR sensors, RADAR sensors, ultrasonic transducers, SONAR sensors, ToF sensors, location sensors (e.g., GPS, compass, etc.), inertial sensors (e.g., inertial measurement units, accelerometers, magnetometers, gyroscopes, etc.), cameras (e.g., RGB, IR, intensity, depth, etc.), wheel encoders, microphones, environment sensors (e.g., temperature sensors, humidity sensors, light sensors, pressure sensors, etc.), etc. The sensor system(s) 104 can output the sensor data 106, which can be received by the computing device(s). In some examples, the data collection devices 102 can be autonomous vehicles that traverse the real environment, as illustrated in FIG. 1. However, the data collection devices 102 can include any computing device that is capable of collecting sensor data 106 in a real environment. The sensor data 106 may include information related to a building type and/or size, for example to filter selection of templates to a particular building sheet style that matches a style of a building observed in the sensor data 106. The building sheet styles may be generated by receiving perceived images from a camera in a real-world environment. The image data may be labeled such that features or items in the images are identified (e.g., pole, sign, door, etc.). The image data may be processed to produce a three-dimensional surface texture or a point cloud representing the real-world environment building surface. The surface texture may then be used as a building sheet for generation of building segments.

The computing device(s) can receive, generate, and/or otherwise access road network data 108 and/or a road mesh 110, which can be based at least in part on the sensor data 106. In at least one example, the road network data 108 may, for example, be a two-dimensional (2D) or a three-dimensional (3D) representation indicating one or more of a driving lane element, a bike lane element, a parking lane element, a crosswalk element, an intersection element, a lane divider element, a traffic light element, a stop sign element, a stop line element, a yield sign element, a yield line element, a driveway element, a speed bump element, jay walking regions (e.g., a virtual crosswalk), trajectory waypoints (e.g., known trajectories), passenger pickup points, a sign location element, a geofence element, and the like. In some examples, the road network data 108 can be encoded with information indicating an attribute of a particular portion of the road network data. For instance, a road line in the road network data 108 can be encoded with information indicating that the road line is associated with a bike lane element, a parking lane element, or a crosswalk element.

The road mesh 110 can comprise 3D tiles (which can be output by a localization system, as described below). Additional details associated with such road network data 108 and/or the road mesh 110 are described in U.S. patent application Ser. No. 15/927,806, filed on Mar. 21, 2018 and U.S. patent application Ser. No. 15/913,647, filed on Mar. 6, 2018, the entire contents of both of which are incorporated by reference herein for all purposes. The computing device(s) can associate the road network data 108 with the road mesh 110 to generate a simulated environment 112. Such an integration may comprise, in at least some instances, projecting the road network data 108 (as 2D or 3D data) into the road mesh 110. That is, techniques described herein are directed to generating a simulated environment (e.g., the simulated environment 112) based on real-world data (e.g., the sensor data 106).

The computing device(s) can receive, generate, and/or otherwise access building dimension data. The building dimension data may include sensor data that includes dimensions of one or more real-world buildings detected by the sensor systems 104. The building dimensions can also be accessed from the third-party source(s) and/or system 114, as described below.

The resulting simulated environment 112 can include accurate heights and surface details (e.g., in view of a corresponding real environment). However, in some examples, there may be holes in the simulated environment (e.g., incomplete data), for instance, with buildings only partially included as sensor data may not capture the complete dimensions of buildings and/or due to occlusions (e.g., parked cars, tight alleyways, etc.) when constructing the road mesh 110. In at least one example, the computing device(s) can access a second, alternate source of data to supplement the existing simulated environment to produce a more realistic simulated environment. For instance, in at least one example, the computing device(s) can access data from third-party source(s) and/or system(s) 114 and can leverage such supplemental data 116 to supplement the existing simulated environment 112. The supplemental data 116 can go beyond the current data set (e.g., road network data 108 and road mesh 110), such that the supplemental data 116 provides information associated with the real environment that is not otherwise available to the data collection device(s) 102 due to occlusion(s) and/or other deficiencies associated with the data collection techniques. In at least one example, the supplemental data 116 can include U.S. Geological Survey (USGS) Data Evaluation Model (DEM) data, etc. The USGS DEM data can comprise a dataset with raster elevation data (e.g., a digital elevation map). The USGS DEM data may not be as accurate as the associated data (e.g., the road network data and the road mesh); however, the USGS DEM data is often more complete. That is, the USGS DEM data may not have holes and thus, such data can be used to supplement data sets that are missing data (e.g., due to occlusions or other deficiencies in data collection). In an additional or alternative example, the supplemental data 116 can include tree map data associated with a real environment, color imagery data associated with a real environment, map data associated with an environment, etc.

Furthermore, the computing device(s) can leverage data associated with characteristics of objects in the environment to further supplement the simulated environment 112. In at least one example, the computing device(s) can access a stored object footprint(s) data storage 118, which stores stored object data 120 representative of footprints of buildings or other stationary objects. In some examples, the footprints may be determined based on the road mesh 110 and/or the road network data 108, but the height of the buildings may not be available from such data. The height of buildings is important in generating simulated environments for testing as described herein because the heights of the buildings will cause shadows and other interactions within the environment that may impact the sensors of an autonomous vehicle. In some examples, such footprints can be associated with annotations regarding height, zoning classification (e.g., residential, commercial, etc.), etc. The computing device(s) can utilize the footprints and associated annotations (e.g., stored object data 120) as a guide mesh for generating façade pieces and rule sets. For instance, in an example, the computing device(s) can associate rule sets with individual stored object footprints. The rules may guide application of a particular building style based on the annotations, for example to apply certain styles to commercial buildings versus residential buildings or industrial buildings.

In at least one example, the building footprints, heights, texturing, and classifications may be randomly defined. In those examples where data associated with such footprints does not have an indication of positioning within a map (e.g., where footprints are randomly determined, retrieved from a data storage of footprints agnostic to a map, etc.), such footprints may be aligned with, or otherwise positioned, such that at least one façade aligns with a street in a road network, is spaced according to one or more rules (e.g., placed a certain distance to a street and, based on the classification, a minimum or maximum distance from other buildings, is orientated in a particular orientation, etc.), and the like. When such rule sets are applied, plausible looking buildings can be generated automatically (e.g., without human modeling) in the simulated environment 112. Utilizing such rules enables the procedural generation of different-looking simulated environments without a significant investment in designer time and/or computational resources. That is, utilizing such rules increases the efficiency with which complex simulated environments can be generated (e.g., via relatively straightforward rules). In some examples, building footprints, heights, texturing, and classifications may be based on sensor data 106 and/or the third-party source(s). In such examples, the dimensions of the buildings, types of buildings, and locations of buildings may be established based on real-world or otherwise defined parameters.

In some examples, the computing device(s) can utilize object component data to add exterior appearances and surface detail to buildings and objects of the simulated environment 112, for instance, during real-time generation. In such examples, the computing device(s) can access an object component data storage 130, which stores surface details included as building segments derived from building sheets, as described herein. The generated object data can include the building segments including architectural features to be applied on the virtual buildings as well as one or more rules to guide application of the building segments in procedural generation of the virtual buildings and objects. Techniques described herein enable designers to model a template that can have multiple different building sheets, such that the template and/or the building sheets can be divided into various building segments and can be used throughout the simulated environment 112. The various building sheets may be for different styles of buildings, including commercial, residential, and industrial buildings, and may include further sub-types of buildings in some examples. The building sheets may define the building segments that may be used as building blocks by the computing device(s) to generate the virtual buildings. The building segments have associated rule sets to guide procedural application of the building segments by the computing device(s). The rule sets can be applied in a manual, semi-automated, or automated method to the building segments.

In a manual process, a user may select a rule from a set of pre-defined rules or define a new rule describing one or more characteristics or limitations for applying the segment within a virtual building, and may select a location on the building segment to apply the rule. The manual process may also include copying and duplicating one or more rules either on the same building segment, or across different building segments. In the semi-automated process, one or more algorithms may identify a feature of the building segment (e.g., a door, building corner, roofline, etc.) and may select one or more rules associated with the identified building feature. The user may then apply the one or more rules or may approve application of the rules as identified by the system. In the automated process, rather than the user applying the identified rules, one or more algorithms, including the feature identification algorithm, may identify rules associated with the identified features and may automatically apply the rules to the building segment, which may later be revised and changed by a user The rule sets can indicate what building segments and/or features or textures to associate with various portions of an object. Such rule sets can be associated with the individual stored building segments and in some examples may be based on one or more parameters (e.g., height, classification, etc.). Such rule sets can indicate how to generate façade pieces from building segments for the objects corresponding to the stored object footprints. As a non-limiting example, a rule set may indicate using a particular building segment or set of segments, texture, etc. for a first floor of a commercial office building (e.g., the building classification), a different mesh, texture, etc. for second (and subsequent) floor of such a building, etc. As such, execution of a rule set can add surface details (e.g., a façade) to an object in the simulated environment. The addition of such details enables realistic-looking simulated environments to be procedurally generated. For instance, façade details can affect shadow casting and/or reflections of windows, which can add complexity to the simulated environment so that it represents real-world conditions.

A resulting simulated environment 134 can be output for use by a simulation computing system. In at least one example, the simulated environment 134 can be useful for enhancing training, testing, and/or validating systems (e.g., one or more components of an AI stack) onboard an autonomous vehicle. For instance, in at least one example, the simulated environment 134 can be useful for training systems that are to be used onboard an autonomous vehicle (e.g., models used by such systems), for instance when real data is not readily available, when testing would be unsafe in a real environment, and in order to generate magnitudes more data than would otherwise be available. In at least one example, the simulated environment 134 can be used for generating training data for rare or infrequently occurring scenarios and/or objects. Moreover, the simulated environment 134 can be useful for testing performance of an autonomous vehicle (e.g., models and/or systems running thereon), for instance, when real environments are either not available or are not safe, or a ground truth is not otherwise available. By having a simulated environment, exact ground truth measurements can be determined for such validations without the need for human based annotations of data. Furthermore, in some examples, sensor data associated with the simulated environment 134 can be more accurate than sensor data associated real environments (e.g., due to occlusions, noise, drift, etc.) and as such, the simulated environment 134 can be used for validating observations made in association with real environments. In some examples, the simulated environment 134 can be used for calibration (e.g., of one or more sensor systems onboard an autonomous vehicle). An example of such a simulated environment is shown and described with respect to U.S. Pat. No. 10,496,766, filed Nov. 5, 2015 and titled "Simulation System and Methods for Autonomous Vehicles," incorporated herein for all purposes.

Figure 2A:
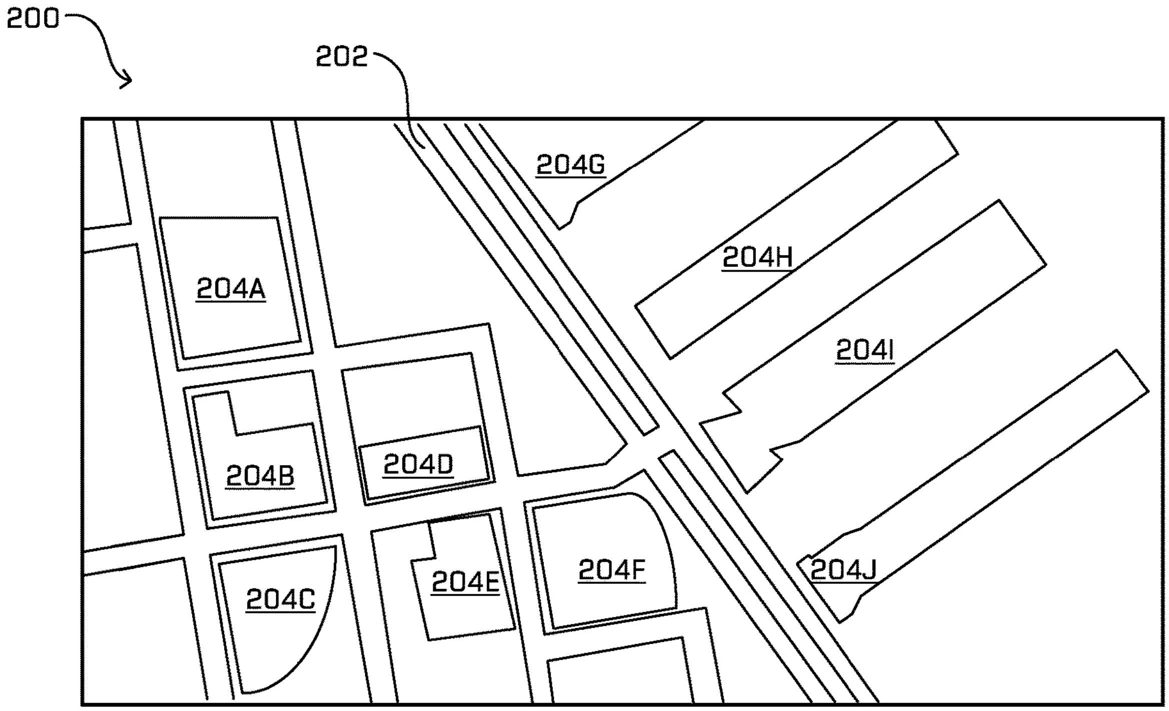
FIGS. 2A and 2B illustrate top-down views of virtual buildings placed within a simulated environment with updating road network data, as described herein.

FIG. 2A illustrates a top-down views of virtual buildings 204 placed within a simulated environment 200 with road network data 202, as described herein. The simulated environment 200 may be an example of a real-world environment modeled within a simulated virtual environment for use in testing one or more systems of a vehicle system through simulation. The simulated environment 200 includes road network data 202 and virtual buildings 204A-J (collectively virtual buildings 204). The virtual buildings 204 may be virtual buildings generated according to the techniques described herein. Because the virtual buildings 204 are a separate dataset from the road network data 202, discrepancies may exist as the road network data 202 is updated.

The road network data 202 is a description of road networks and contains descriptions and annotations for particular lanes and drivable surfaces. In some examples, the road network data 202 may described sidewalks, curbs, and other information. In some examples, the road network data 202 may only described the drivable surfaces within the simulated environment 200. The road network data 202 may be derived directly from sensor data gathered by one or more vehicles operating within the real-world environment. Because of the data gathering by one or more vehicles, changes may occur to the road network data 202 over time, particularly to update, add additional road data, and further refine the road network data 202. As part of the updates, the road network data may move and stretch in one or more dimensions, while other data, such as the virtual buildings 204 may not be able to move in the same way and may cause overlaps and intersections with the road network data 202, for example as illustrated in FIG. 2B.

Figure 2B:
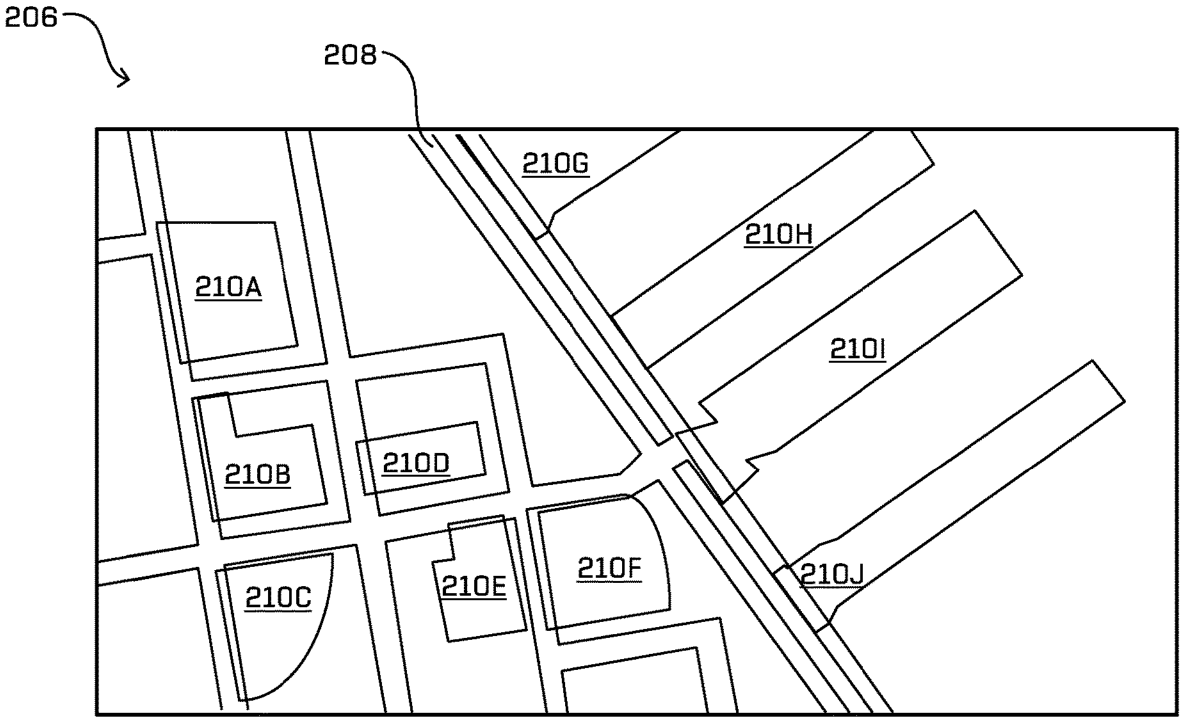

FIG. 2B illustrates a top-down views of virtual buildings 210 placed within a simulated environment 206 with updated road network data 208, as described herein. As described above, the road network data 202 is updated to the updated road network data 208 that may involve a shift, change in shape and/or dimension of one or more parts of the data, or other such changes. The result is that the updated road network data 208 may intersect and overlap with the virtual buildings 210 (which may be the virtual buildings 204 of FIG. 2A). Accordingly, the virtual buildings 210 may need to be updated and/or replaced to fit with the updated road network data 208. The generation of virtual buildings, particularly virtual buildings that may have to change footprint or dimensions, can cost enormous amounts of time in generating the simulated environment 206. The techniques described herein provide for generation of virtual buildings to fit with the updated road network data 208 in a fast and efficient manner while also providing for a realistic simulated environment 206 for the vehicles to be simulated within.

Figure 3:
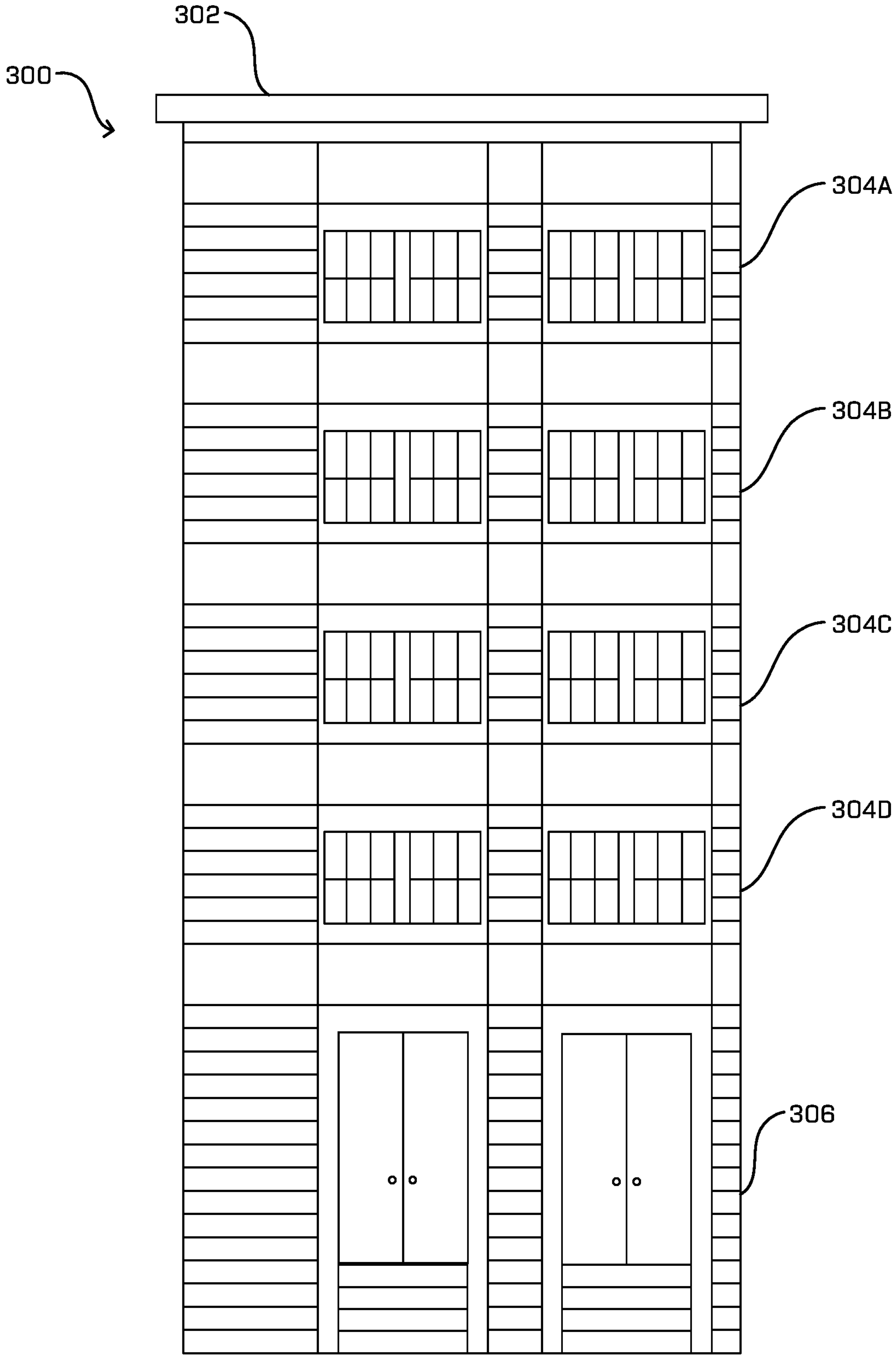
FIG. 3 illustrates an example facade of a virtual building style, as described herein.
Figure 4:
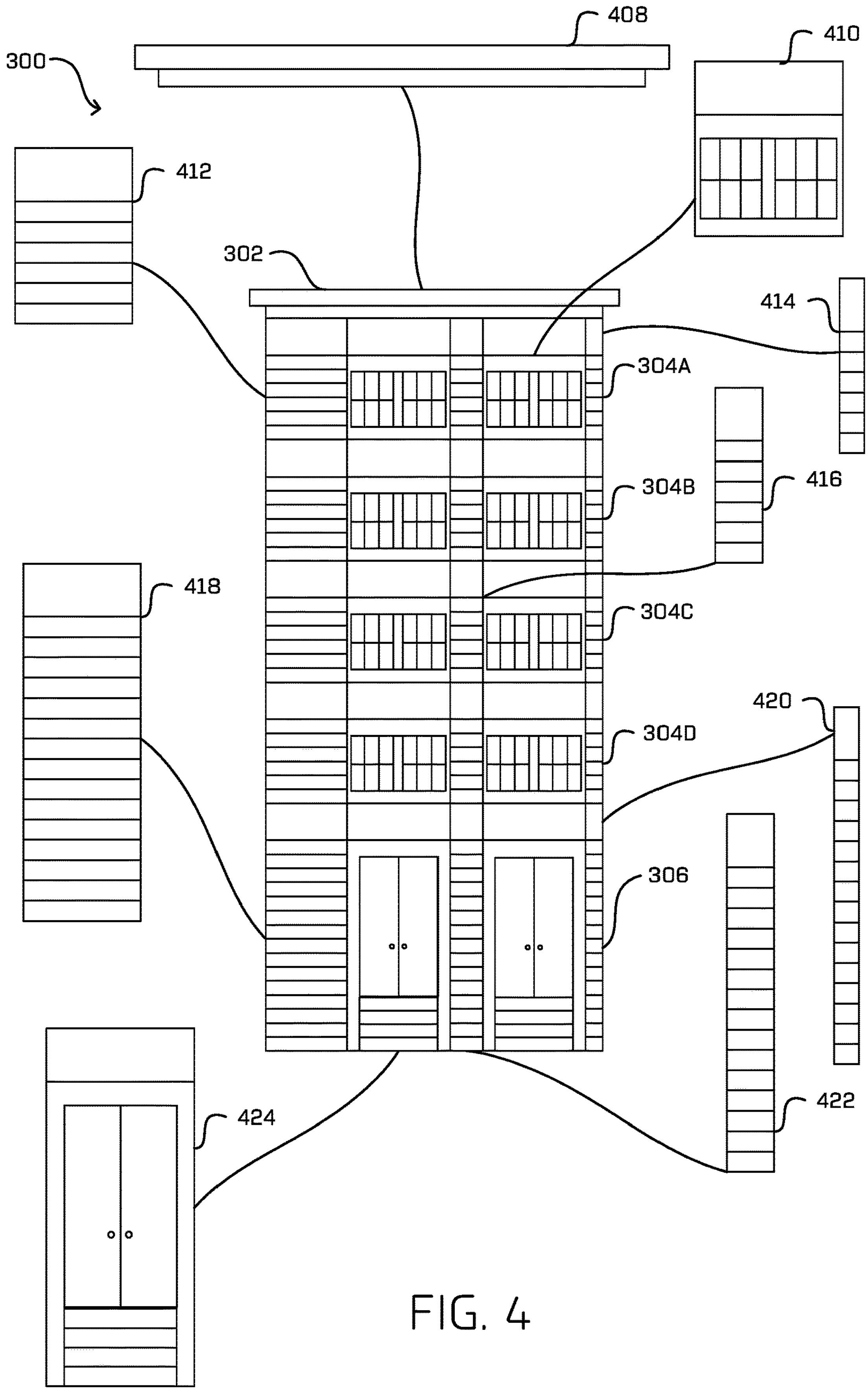
FIG. 4 illustrates an example extraction of building segments from the facade of FIG. 3, as described herein.

FIGS. 3-5 depicts a building sheet of a virtual building that may be accessed, according to the techniques described herein. The building sheet may be divided into building segments and/or features that may be identified and stored with particular rules and rule sets. The rule sets define the applications of the building segments to a virtual building and are used by a computing device implementing a procedural generation algorithm to produce one or more virtual buildings having the style of the building sheet for populating a simulated environment. Though a single building sheet is shown and discussed herein with simplified geometry, additional styles and building features may be included and may have varying levels of details as defined by the generators of the various building sheets.

FIG. 3 illustrates an example building sheet 300 of a virtual building style, as described herein. The building sheet may be generated by an artist or user who may style the building sheet 300 after a particular architectural style and/or for a particular intended building use (e.g., based on zoning for land-use; commercial, residential, industrial, etc.). The building sheet 300 may be designed to include multiple architectural features and may be used to divide into various building segments (for example as shown in FIG. 4) that may be used for producing virtual buildings in a procedurally generated manner.

The building sheet 300 include a roof section 302, floors 304A, 304B, 304C, 304D, and a ground floor 306. In some examples, the building sheet 300 may be specifically generated for the purpose of creating building segments. In some examples, the building sheet 300 may be generated or accessed from a library of building sheets, for example a library of building style guides may be used for building sheet 300. The building sheet 300 is shown with multiple repeating floors 304A-D, though in some examples, the building sheet 300 may be designed by the user to include only one instance of a plurality of architectural features. The building sheet 300 may, for example, be a residential building having a modern style. Accordingly, the building sheet 300 may be stored initially with tags reflecting the residential application of the building as well as the architectural style being modern.

In some examples, the building sheet 300 may include surface textures and parametrizations such as shaders, attachment locations, and animations or movements for various components (e.g., configurable windows that may be in an open or closed configuration. The building sheet 300 may also include a roof height offset that may be applied to an upper edge or spline of a building and define different roof styles and roof shapes that may be applied along the roofline of the building.

FIG. 4 illustrates an example extraction of building segments from the building sheet 300 of FIG. 3, as described herein. The building segments are extracted from the building sheet 300 and may be identified based on their identities. Each of the building segments may have one or more architectural features. For example, in FIG. 4, the building segment 408 corresponds to a roof and upper molding along a roof edge, building segment 410 includes a window and window surround, building segment 412 includes a corner edge of a building with a brick-like texture, building segments 414, 416, 418, 420, and 422 include a corner edge similar to building segment 412 but having different dimensions in length and/or width, and building segment 424 includes stairs and a doorway. The building segments may include a single feature such as a window, molding, wall section, door, stairs, balcony, and other such elements. In some examples, the building segments may include multiple architectural features, for example as pictured herein the building segments 408-424 include multiple building features in each segment.

The building sheet 300 can be divided into these segments by a manual or automated procedure to generate building segments 408-424 useful for generating myriad virtual buildings. The building sheet 300 may be divided by an individual using a computer tool to select various building segments in a manual manner. In some examples, architectural features of the building sheet 300, such as the windows, roof, corners and edges, doors, stairs, etc., may be identified within the building sheet 300 using an algorithm, such as an image or pattern recognition machine learning algorithm trained using labeled architectural feature data. The algorithms may segment the building sheet 300 to the individual features and/or into building segments having multiple features as described herein. In some examples, the algorithms for dividing the building sheets may identify edges, lines, boundaries, or other such divisions between features, and divide the segments according to the identified boundaries. Though depicted herein as having multiple features in the building segments 408-424, in some examples the building segments may include only a single feature, such as a single window, edge segment, single stair, etc. The building segments 408-424 may be laid out in the building sheet along horizontal and vertical guidelines that may be used to guide cutting of the building sheet into the building segment. The division along the horizontal and vertical lines may be performed by hand and/or by an automated process based on edge detection and identification of the vertical and horizontal lines dividing the building sheet.

In some examples, the building sheet 300 may be divided by a sequential process that cuts the building sheet into successively smaller building segments. For example, the building sheet 300 may be cut along horizontal lines dividing the floors 304A-D and 306 to generate sub-units that may be further divided. The sub-units may be divided by one or more edges and/or or features. For instance, the floors 304A-D may be divided by vertical lines between the sections. In this manner, building segments may be divided in a sequential manner until the building segments are small enough to include only one architectural feature. In some examples, the building segments may be stored as the sequential cuts are performed. For example, the floor 304A may be stored as a building segment, the building segment 410 may be stored as a sub-component of the floor 304A, and the window may further be stored as a building segment. In this manner, varying levels of detail for building segments may be stored either individually or together. When producing a virtual building, the computing device(s) may draw from the building segments at varying levels of detail to generate the building sheet for the virtual building.

Figure 5A:
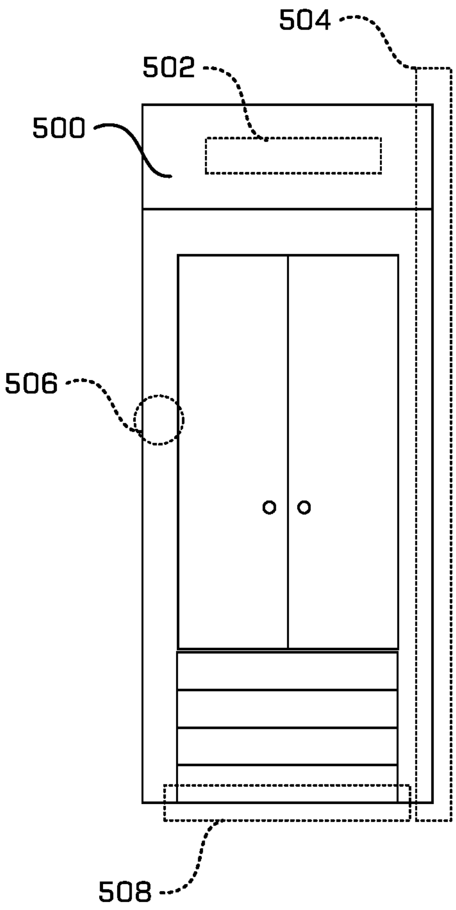
FIGS. 5A-5C illustrate examples of rule application to the building segments of FIG. 4, the rule applications defining procedural building limitations for each segment, as described herein.
Figure 5B:
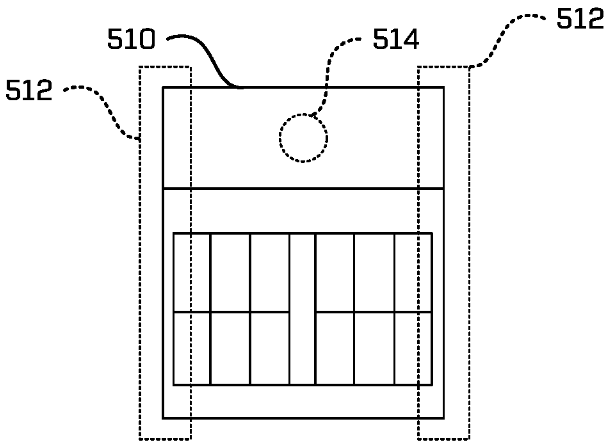
Figure 5C:
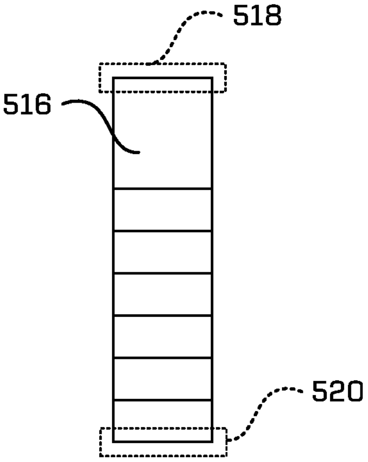

FIGS. 5A-5C illustrate examples of rule application to the building segments of FIG. 4, the rule applications defining procedural building limitations for each segment, as described herein. After the building segments are drawn from the building sheet 300 as shown and described with respect to FIG. 4, the building segments are assigned rules that may be used for attachments and construction of virtual buildings. The building segments 500, 510, and 518 are three of the building segments from the building sheet 300, and may represent the building segments 410, 412, 414, 416, 418, 420, 422, and 424. The building segments 500, 510, and 516 are shown with example rules assigned to particular edges and/or locations. In some examples a user interface tool may enable placement of and definition of rules to be applied to each of the segments. Additionally, the user interface tool may enable manipulation, editing, and storage of the building segments, associated rules, and other features of the building segments.

Custom building controls sit inside each building segment and describe various attributes of the underlying structure. In the user interface tool, the building controls (e.g., rules) may be copied and duplicated, dragged, and manipulated using common graphical or other user interface controls. Though particular rules and features are shown and identified with respect to building segments 500, 510, and 516, other features, rules, and configurations may be used and are envisioned according to this description.

In the building segment 500, the front door and steps are shown with rules applied to the building segment 500 defining how the building segment 500 is used in generation of a virtual building. For example, at location 502 a feature may be applied indicative of an ability for a particular element to attach, such as a building number, business name, or other such building feature. A second location 504 selects an edge of the building segment 500 and defines types of building segments that may be placed adjacent and/or how the building segment may be scaled or tiled in a horizontal direction. For example, only certain building segments may be placed adjacent that may exclude building segments that would produce an irregular or unnatural appearance adjacent to the door. Additionally, the building segment 500 may be indicated as tileable in the horizontal direction either to an infinite degree, or with restrictions. The restrictions may limit a number of instances of the building segment 500 that may be placed adjacent one another. The restrictions may also define a pattern of tileable elements that may be placed together in a pattern along the horizontal direction. A third location 506 may be used for optional placement of a mailbox and/or flag, or other architectural features. A fourth location 508 may be associated with the stairs and may define how the stairs may be scaled, for example to adjust the number of stairs or height of stairs based on the scaling of the building feature 500 or the height of the door from the road network ground. Additional rules may be applied to the building segment 500 that may define the possible locations for the building segment in the virtual building, for example to limit to a ground floor.

Turning to the building segment 510, locations 512 and 514 may define additional attachment points describing what building blocks and/or architectural features may be attached at the various locations. Additionally, the locations 512 may be associated with a tiling rule as described above but may also define a scaling factor for the building segment 510. The scaling factor may restrict or limit scaling of the building block 510 in either the horizontal or vertical direction as a result of maintaining a particular aspect ratio or appearance. As with the building segment 500, the building segment 510 may be assigned global rules to define application at or above a first floor of the virtual building. Additional features may define the features of the window, e.g., whether the window is capable of opening and whether it slides or tilts or rotates to open.

The building feature 516 may be a building feature that is generated to represent several of the building features of FIG. 4. For example, the building feature 516 may be scaled in one or more of the horizontal and/or vertical directions to produce the building segments 412, 414, 416, 418, 420, and 422. Accordingly, the features 518 and 520 may define the ability to scale within the range of sizes required to produce those various building features from a single element. The building feature 516 may be assigned to be applied only on corners of buildings in some examples and may be assigned particular tiling abilities in a vertical direction, while tiling in a horizontal direction may be limited.

In use, the building segments 500, 510, and 516, among other building segments may be used to populate a frame or dimensions of a virtual building a produce a realistic looking virtual building.

Figure 6:
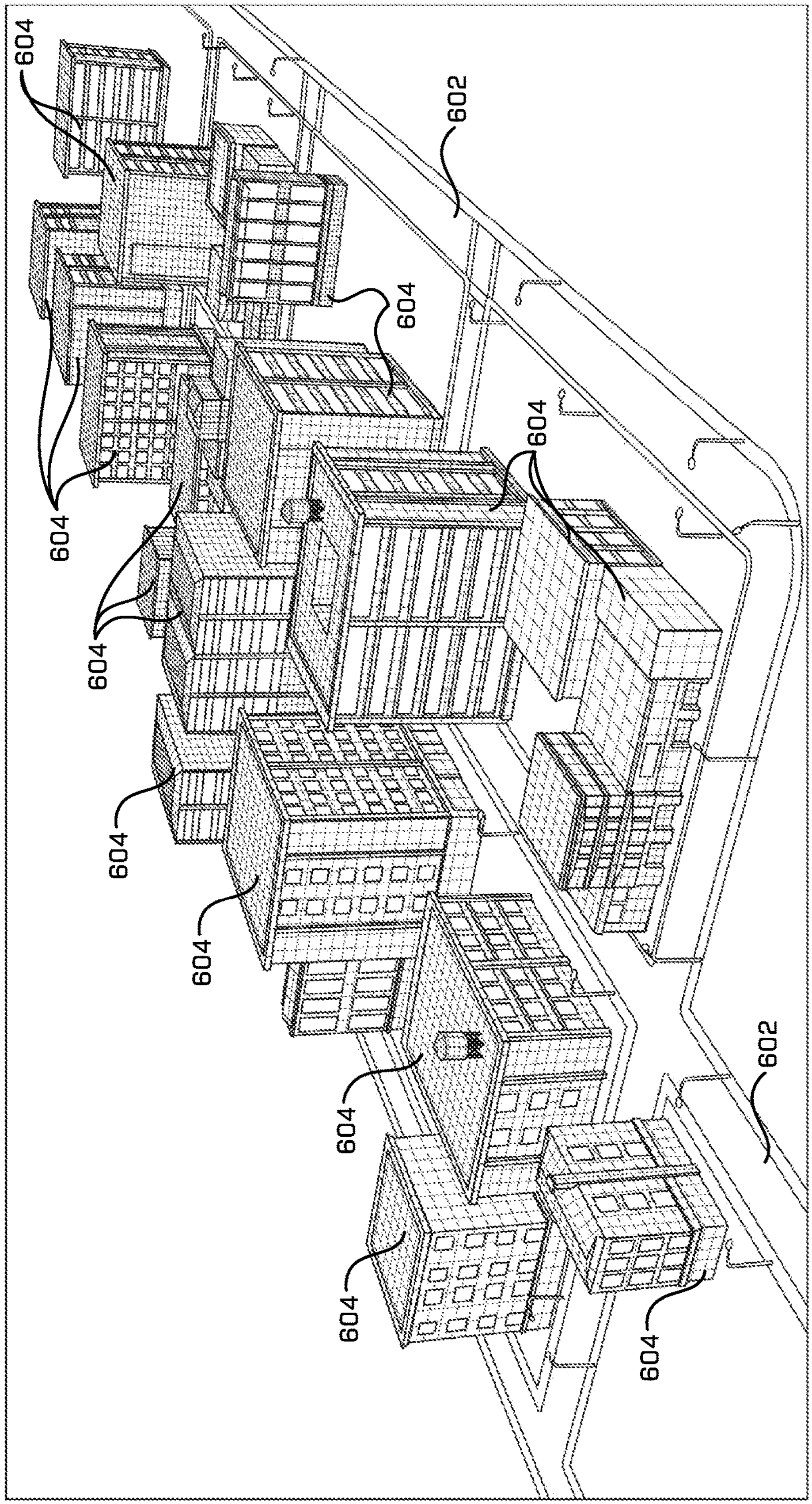
FIG. 6 illustrate non-limiting examples of various aspects of procedural generation of a simulated environment, as described herein.

FIG. 6 illustrates a non-limiting example of a representation of a simulated environment 600 generated using procedural generation of virtual buildings, as described herein. Though depicted as a flat simulated environment, the techniques described herein enable simulation of environments on three-dimensional surfaces describing hills, valleys, and other contours of a real-world environment. In this manner, accurate elevation may be preserved in the simulated world. As described above, data collection device(s) 102 can generate sensor data 106 associated with a real environment via sensor system(s) 104. Computing device(s) can receive the sensor data 106 and receive, generate, and/or otherwise access road network data 108. In at least one example, the road network data 108 may, for example, be a 2D or a 3D representation of the real environment (or a portion thereof) indicating one or more of a driving lane element, a bike lane element, a parking lane element, a crosswalk element, an intersection element, a lane divider element, a traffic light element, a stop sign element, a stop line element, a yield sign element, a yield line element, a driveway element, a speed bump element, jay walking regions (e.g., a virtual crosswalk), trajectory waypoints (e.g., known trajectories), passenger pickup points, a sign location element, a geofence element, and the like. Additionally, the computing device(s) can generate a road mesh 110. In at least one example, the sensor data 106 can comprise LIDAR data, which can be used to generate a 3D point cloud representative of the real environment, as illustrated in FIG. 2B. In at least one example, the computing device(s) can generate the road mesh 110 based on the 3D point cloud. The road mesh 110 can comprise 3D tiles. The computing device(s) can associate the road network data 108 with the road mesh 110 to generate a simulated environment 112. Such an integration may comprise, in at least some instances, projecting the road network data 108 (as 2D or 3D data) onto the road mesh 110.

As described above, the resulting simulated environment 112 can include accurate heights and surface details for the road mesh (e.g., in view of a corresponding real environment). However, in some examples, there may be a lack of complete and realistic virtual buildings in the simulated environment 112. In at least one example, the computing device(s) can access a second, alternate source of data to supplement the existing simulated environment (e.g., to populate with virtual buildings between the road mesh 110). As described above, the supplemental data 116 can include USGS DEM data associated with a real environment, tree map data associated with a real environment, color imagery data associated with a real environment, map data associated with an environment, etc.

Furthermore, the computing device(s) can leverage data associated with characteristics of objects in the environment to further supplement the simulated environment 112. In at least one example, the computing device(s) can access a stored object footprint(s) data storage 118, which stores stored object data 120 representative of footprints of buildings or other stationary objects. In some examples, such footprints can be associated with annotations regarding height, classification (e.g., residential, commercial, etc.), rule sets, etc. The computing device(s) can utilize the footprints and associated annotations (e.g., stored object data 120) as a guide mesh for generating appearances of realistic looking virtual buildings, as described above. In at least one example, the building footprints, heights, texturing, rule sets, and/or classification may be randomly defined. In those examples where data associated with such footprints does not have an indication of positioning within a map (e.g., where footprints are randomly determined, retrieved from a data storage of footprints agnostic to a map, etc.), such footprints may be aligned with, or otherwise positioned, such that at least one façade aligns with a street in a road network, is spaced according to one or more rules (e.g., placed a certain distance to a street and, based on the classification, a minimum or maximum distance from other buildings, is orientated in a particular orientation, etc.), is orientated based on one or more rules, and the like. When such rule sets are applied, plausible looking buildings can be generated automatically in the simulated environment 112, as described herein.

In some examples, the computing device(s) can utilize generated object data to produce realistic looking appearances for the virtual buildings to be placed in the simulated environment 112, for instance, during real-time generation. In such examples, the computing device(s) can access an object component data storage 130 which stores building segments and associated rules as described herein.

FIG. 6 illustrates a non-limiting example of the resulting simulated environment 600, which can be for enhancing training, testing, and/or validating systems (e.g., one or more components of an AI stack) onboard an autonomous vehicle, as described herein. That is, in some examples, the resulting simulated environment 600 can be used for training, testing, and/or validating algorithm(s) used by onboard systems of an autonomous vehicle, which can be used by the autonomous vehicle to control the autonomous vehicle. The road network 602 includes the data from the road mesh and the road network data while the buildings 604 are produced according to the techniques described herein.

Figure 7:
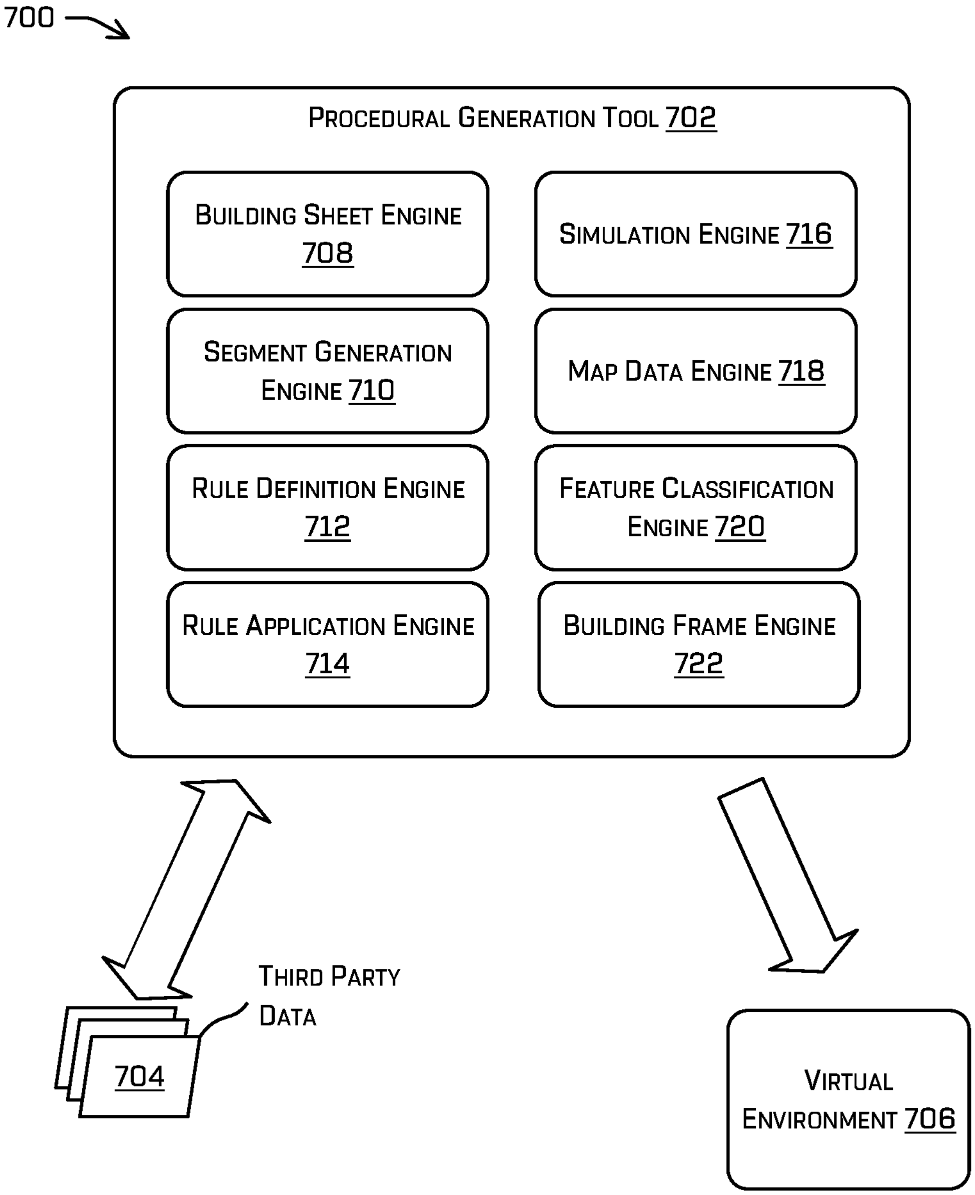
FIG. 7 illustrates an example block diagram showing elements of a procedural generation tool, as described herein.

FIG. 7 illustrates an example block diagram 700 showing elements of a procedural generation tool 702. The procedural generation tool 702 may be implemented on a computing device in communication with a vehicle system and may be implemented on a computing device such as the computing devices(s) 932 of FIG. 9. The procedural generation tool 702 is shown as including several discrete components and/or components. The procedural generation tool 702 may be structured and divided in other ways to suit particular implementations of the techniques described herein.

The procedural generation tool 702 may communicate with one or more additional computing device(s) for example to access third party data 704 that may describe the dimensions, types, and applications of buildings in a real-world environment and may also access building sheets generated for virtual buildings. The procedural generation tool 702 may also communicate with another computing device and/or component that hosts the virtual environment 706, such as the simulated environment 600 of FIG. 6.

The procedural generation tool 702 includes a building sheet engine 708, a segment generation engine 710, a rule definition engine 712, a rule application engine 714, a simulation engine 716, a map data engine 718, a feature classification engine 720, and a building frame engine 722. The procedural generation tool 702 may include additional or fewer components and may be located in a single location (e.g., a single computing device) or may be distributed across multiple computing devices.

The building sheet engine 708 may be used by the procedural generation tool 702 to access one or more previously generated building sheets that may be used to defining building segments to assemble virtual buildings. The building sheet engine 708 may, in some examples, include a graphic designing program, such as a three-dimensional animation and rendering tool, configured to enable a user to generate an artistic representation of at least a portion of a building sheet for the building. The portion of the building sheet may include multiple different architectural features and may be only a portion of a building. In some examples, the building sheet may be entirely fictional and may not represent an entire building sheet for a building but may only reflect a portion of a building sheet, including one or more features. The building sheet engine 708 may access such building sheets previously generated, and in some examples, may include an automated tool that receives an input, such as an input image, and automatically generates a digital representation of a building sheet included within the input image.

The segment generation engine 710 may be used by the procedural generation tool 702 to divide the building sheets accessed and/or received by the building sheet engine 708 into building segments of varying levels of detail and granularity. The building sheet may be divided by the segment generation engine 710 into segments by a manual or automated procedure to generate building segments useful for generating myriad virtual buildings. The building sheets may be divided by an individual using a computer tool interface to select various building segments in a manual manner. In some examples, architectural features of the building sheet, such as the windows, roof, corners and edges, doors, stairs, etc., may be identified within the building sheet using an algorithm, such as an image or pattern recognition machine learning algorithm trained using labeled architectural feature data. The feature classification engine 720 may be used to perform the feature identification in some examples, either before and/or after segmenting the building sheet. The algorithms may segment the building sheet to the individual features and/or into building segments having multiple features as described herein. In some examples, the algorithms for dividing the building sheets may identify edges, lines, boundaries, or other such divisions between features, and divide the segments according to the identified boundaries.

In some examples, the building sheets may be divided by a sequential process that cuts the building sheet into successively smaller building segments. For example, the building sheets may be cut along horizontal lines dividing the floors to generate sub-units that may be further divided. The sub-units may be divided by one or more edges and/or or features. For instance, the floors may be divided by vertical lines between the sections at various natural edges and features. In this manner, building segments may be divided in a sequential manner until the building segments are small enough to include only one architectural feature. In some examples, the building segments may be stored by the segmentation generation engine 710 as the sequential cuts are performed. When producing a virtual building, the computing device(s) may draw from the building segments at varying levels of detail to generate the building sheet for the virtual building.

The rule definition engine 712 may be used by the procedural generation tool 702 to define one or more rules that describe how the building segments may interact with one another as well as locations where the building segments may be placed and are restricted from being placed, as well as defining abilities for the segments to repeat, morph, change shape, and otherwise be adjusted. For example, the rules may describe a portion of the building where the segment may exist (e.g., first floor, top floor, corner, edge, etc.). The rules may also describe how the building segments may be morphed and/or adjusted to fit particular geometry (e.g., how to scale or stretch the segments in one or more dimensions to fit a particular dimension of a building). The rules may also describe how the building segment may be applied relative to surrounding building segments, for example to describe whether the segment may be tiled in a vertical and/or horizontal direction, what categories or types of building segments may be adjacent, and what building segments or features may be applied to the building segment (e.g., describing a location where a flagpole may be attached to a building entrance segment). The rule definition engine 712 may access or include a set of possible rules that may be applied to the building segments. The rule application engine 714 may be used to apply the rules to the one or more building segments.

The rule application engine 714 may be used by the procedural generation tool 702 to apply and/or attach one or more of the rules defined by the rule definition engine 712 to the building segments. In some examples a user interface tool may enable placement of and definition of rules to be applied to each of the segments. Additionally, the user interface tool may enable manipulation, editing, and storage of the building segments, associated rules, and other features of the building segments.

As part of the rule application engine, custom building controls sit inside each building segment and describe various attributes of the underlying structure. In the user interface tool, the building controls (e.g., rules) may be copied and duplicated, dragged, and manipulated using common user interface controls.

The simulation engine 716 may be used by the procedural generation tool 702 to produce one or more simulated environments, for example by generating the virtual buildings for placement in a simulated environment including road network data. The simulation engine 716 may be capable of performing the simulation or may be used to communicate the generated virtual buildings to the computing device(s) hosing the virtual environment 706.

The map data engine 718 may be used by the procedural generation tool 702 to access map data, for example including the road mesh, road network data, and real-world map data that may be used to generate the virtual environment 706. The map data engine 718 may access map data from third party data 704 and/or from sensor data gathered by sensors of the vehicles, as described herein.

The feature classification engine 720 may be implemented by the procedural generation tool 702 in automating one or more processes for identifying features of the building sheets and/or building segments. The feature classification engine 720 may include one or more trained algorithms capable of identifying architectural features within a building sheet and/or as part of a building segment. The feature classification engine 720 may identify the type of architectural feature at varying levels of specificity, and may, in some examples, include identification of an architectural style associated with the features. In this manner, the segment generation engine 710 may use the feature classification engine 720 to automatically identify features for extraction as building segments. The rule definition engine 712 and the rule application engine 714 may also implement the feature classification engine in selecting and/or applying subsets of rules to the identified features.

In an example, the feature classification engine 720 may identify a particular architectural feature in a building sheet and the segment generation engine 710 may automatically extract the feature as a building segment. The feature classification engine 720 may identify a type of architectural feature associated with the feature. The type of architectural feature may be used by the rule definition engine 712 to identify a subset of all of the available rules to suggest and/or automatically apply to the building segment via the rule application engine 714. The subset of rules may be based on rules applied to other features of the same type. The rule application engine 714 may then apply or provide the subset of rules for a user to apply to the building segments. In an automated example, the subset of rules may be duplicated from a separate building segment of the same feature type and copied onto the new building segment, thereby increasing a speed of rule application for the various building segments.

The building frame engine 722 may be used by the procedural generation tool 702 to generate a frame and/or structure to which the building segments may be applied during the procedural generation process. In particular, the building frame engine 722 may access the building footprint data and/or building dimension data from the sensor data and/or the third party data 704 and may generate a frame for the virtual building where the building segments may be applied and attached to produce the final virtual building, with the building segments applied to the building frame according to the various rules and constraints of the building segments. The building frame engine 722 may also be used to define an architectural type and style for the building, based on real-world types of buildings (commercial, residential, industrial) that may be available from third party data 704.

Figure 8:
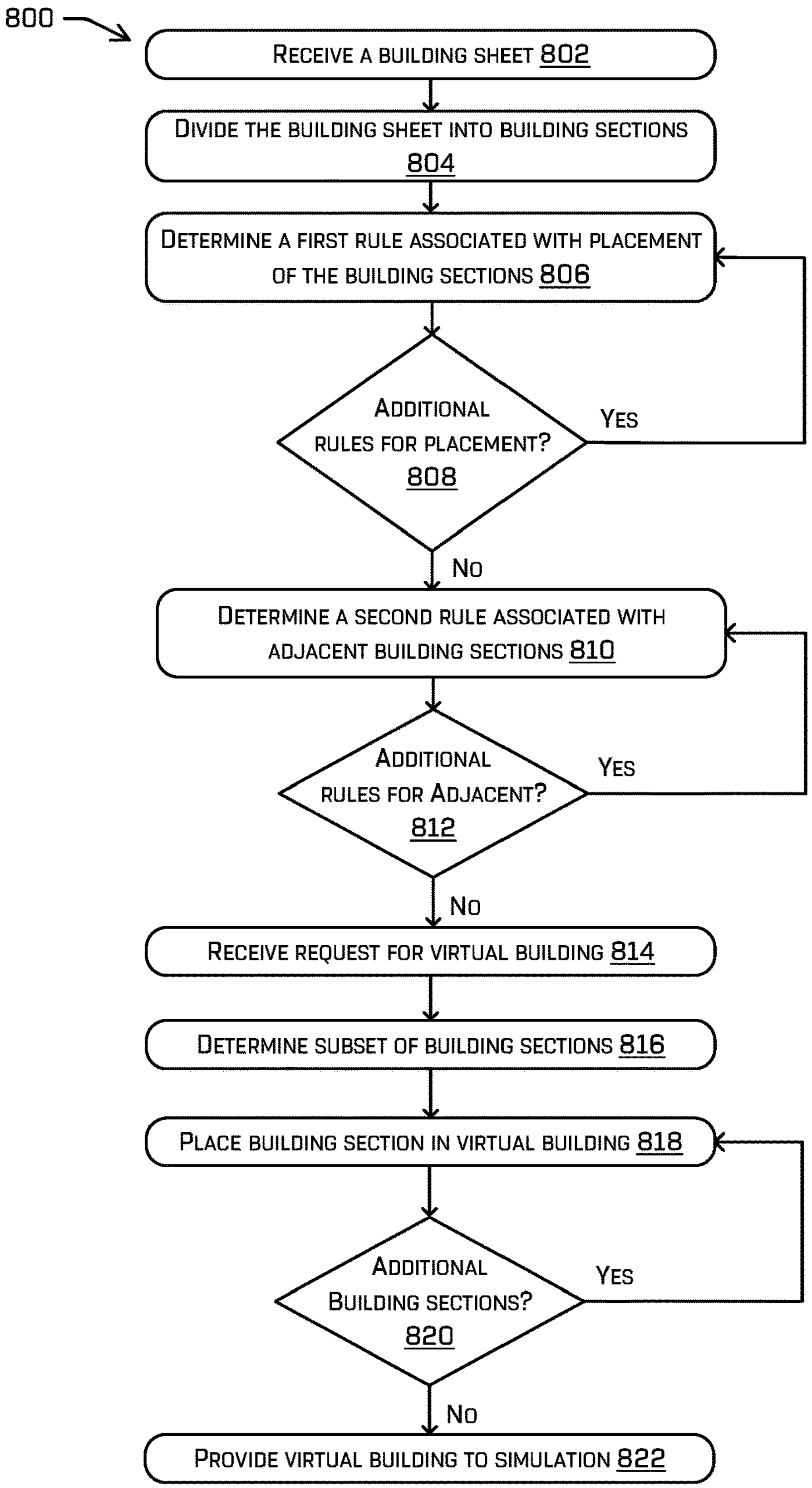
FIG. 8 illustrates an example flow diagram for applying rules to automate procedural generation of a virtual building, as described herein.

FIG. 8 illustrates an example process in accordance with examples of the disclosure. The process is illustrated as a logical flow graph, each operation of which representing a sequence of operations that may be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations may be omitted and/or combined in any order and/or in parallel to implement the processes.

Figure 9:
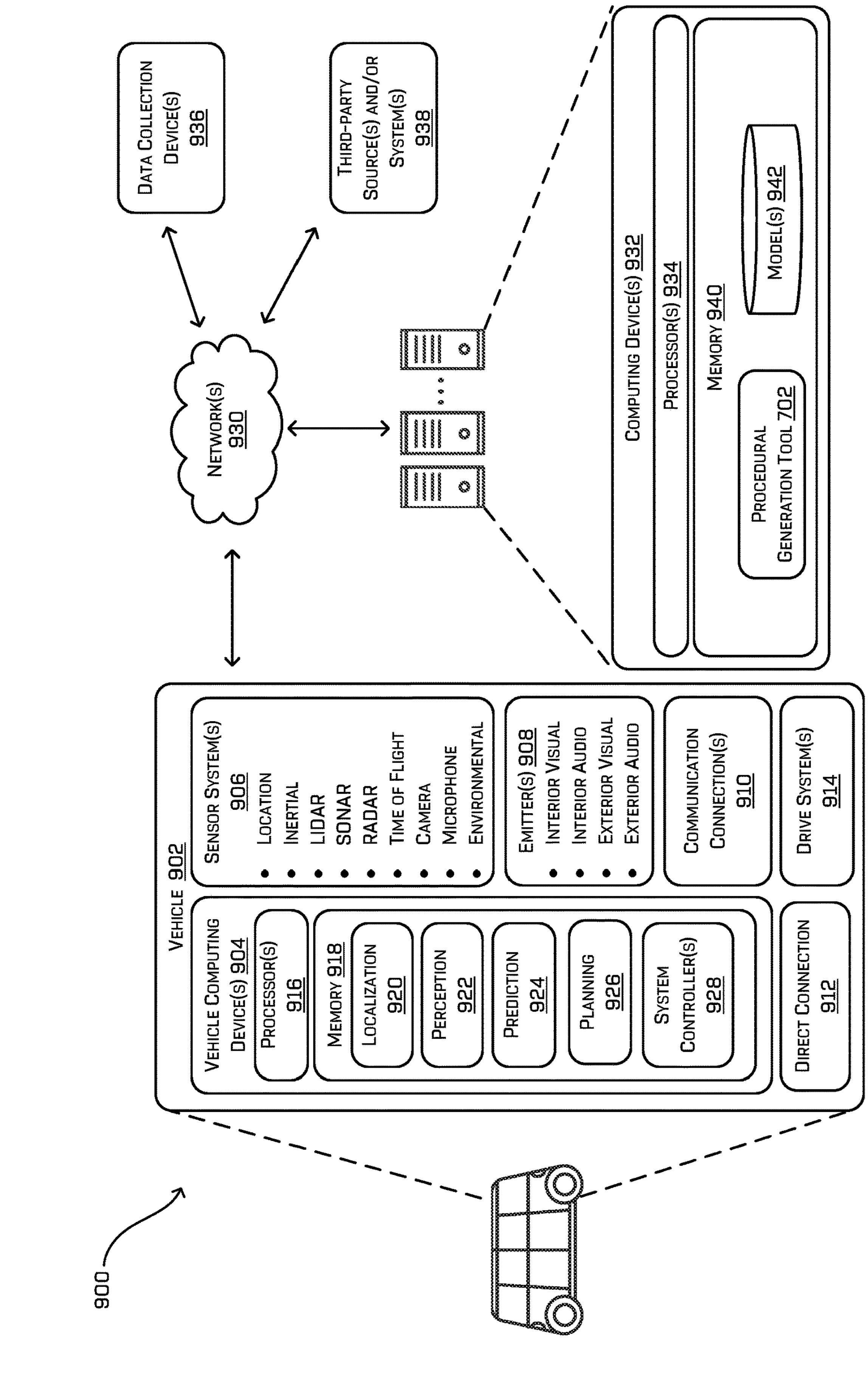
FIG. 9 illustrates an example block diagram of a system illustrating elements that may enable procedural generation of buildings and simulated environments, as described herein.

FIG. 8 illustrates an example flow diagram for a process 800 that may be performed by a computing device, such as the computing device 932 of FIG. 9, that may host a procedural generation tool 702 according to FIG. 7, that may be used to carry out some or all of process 800.

At 802, the process 800 includes receiving a building sheet for an exterior of a building. The building sheet may be accessed from a storage system where one or more generated representations of different architectural styles may be stored. The building sheets may include all or a portion of a fictitious or real-world building. In some examples the building sheets may be generated through the use of a building sheet engine 708 of the procedural generation tool.

At 804, the process 800 includes dividing the building sheet into building sections. The division of the building sheet may be performed by the segment generation engine 710. The segmentation may be performed manually or in an automatic manner. In a manual manner, an individual may determine cuts to divide the sections of the building sheet. In an automated fashion, a feature classification engine may identify one or more features within the building sheet and generate building sections based on those identified features. The features may include identities of particular features, such as windows, or may include identification of dividers, such as lines generated by edges of features that form natural divisions between building sections.

At 806, the process 800 includes determining a first rule associated with placement of the building sections. The first rule may define one or more regions or sections of the final building where the building section may be placed. The regions may include at a ground floor, at or near a roofline, corners, edges, particular middle floors, etc. The rules may be defined by the rule definition engine 712, and in some examples the rules may be determined based on the identity of the architectural features of the building sections. At 808, the process 800 may further determine if multiple rules of the first rules should be applied, for example to identify building sections that serve as corners but also lie at a first floor of a building due to the presence of a door. In such examples, the feature extraction of the door may aid in selection of the first-floor rule while the presence of an external corner on one edge may indicate application of the corner placement rule.

At 810, the process 800 includes determining a second rule associated with adjacent building sections. The second rule relates to relationships between adjacent building sections, such as which building sections may attach to one another. In an example, a mailbox or flagpole may attach to particular building sections only where appropriate. Additionally, an awning may be assigned a rule to only attach to building sections above a doorway or window. At 812, the process 800 may further determine if multiple rules of the second rules should be applied to the building section. Additionally, the process 800 may include determining feature locations for the rules to attach. For example, a rule defining placement of an awning may be attached above a doorway or window.

At 814, the process 800 includes receiving a request for a virtual building. The request may be from a user input or may be from a simulation engine filling in a simulated environment and requesting a virtual building to fit within a particular location. The request may include a request for particular building type, architectural style type, and building size. The building size may be derived from third-party data and/or from sensor data associated with the computing device (for example including the sensor data of an autonomous vehicle).

At 816, the process 800 includes determining a subset of building sections. The subset is determined based on a location within a building frame for the building section to be applied. The first rule, for example, may define that a subset of building sections may be placed at a ground floor and therefore be available for placement at the ground floor of the building being generated.

At 818, the process 800 includes placing a building section at the location in the virtual building. In some examples the subset of building sections may include a single building section that is selected. In some examples the subset may include multiple building sections. In event that no other rules apply for placement of the building, then a building section of the subset may be selected at random for placement in the location. At 820, the process 800 includes placing additional building sections according to the first rule and/or the second rule. The second rule may be used to select a building section for placement if multiple building sections are available after application of the first rule. The additional building sections may be placed within the building frame until the building is fully populated.

In some examples surfaces of generated buildings, may be mitered together at corners to generate the three-dimensional building. For example, the process 800 may include generating individual surfaces for planes of the building being generated and subsequently mitering together the surfaces to produce a completed virtual building. In some examples, the building may be generated by placing the building segments simultaneously on a building wireframe, defined by the splines of the building, without mitering the corners of the surfaces. In such examples, the corner building segments may be selected and placed to provide a consistent appearance around the corner of the building, for example such that building segments adjacent one another at a corner are aligned together.

At 822, the process 800 includes providing the populated virtual building to a simulated environment. For example, the building may be provided within a simulated driving environment for testing one or more systems or features of an autonomous vehicle as described herein.

In a particular example of the process 800, a building may be generated for use in a simulation. In the example, a building sheet having a particular style is received at 802, The building sheet may be for a residential building. The building sheet is then divided into building sections at 804 as described herein, by a manual and/or automated process. At block 806, the process 800 includes determining and applying rules for procedural generation to the building segments, beginning to generate the building from the building segments. The building segments may be divided into classes, for example, the building segments may be identified as corners, tileable and/or repeatable segments, spacers, etc. At block 808, additional rules may be applied to the segments, the rules may include identification of building segments to fit along a ground floor, top floor, or attachment locations for additional features. At blocks 810 and 812, the process 800 includes identifying rules describing positioning of adjacent building segments. The rules may describe for example, what building segments may be placed adjacent corners segments, within a center space of the building, along edges, etc.

At block 814, a request for a virtual building is received. The building may be procedurally generated based on dimensions of the building provided into a procedural generation tool. The dimensions of the building may be received with the request or may be accessed by the procedural generation tool based on a determined location for the building to be placed within the simulation. Initially, the procedural generation tool may define the splines of a building are defined based on the building dimensions, the splines defining edges of the building shape. After identifying the splines of the building forming the outline or shape of the building, at block 816 a subset of building segments may be identified. The subset of building segments may generally include building segments applicable to the architectural style of the building, for a consistent appearance within the building. The subset of building segments may also include identification of corner building segments for placement within the building. The corner building segments are identified based on the classes of the building segments as well as the applied annotations. For example, at block 818, a building segment identified as a corner building segment with an annotation indicating it is for use on a ground floor of a building may be placed at a ground floor corner location. At block 820 additional corner building segments are placed based on the annotations, which may include the classes of the building segments, for example to continue with a corner building segment annotated to be positioned at a roof of the building. After placing the corner building segments, and as part of block 820, the building segments to fit between the corners are selected based on a length of the splines extending between the corners. Tileable building segments, (e.g., building segments annotated as tileable along the direction of the building spline to be populated), are placed along the spline between the corners. The tileable elements are placed in a repeating manner to fill the space between the corner building segments. Any remaining gaps or spaces may be filled using a different building segment annotated as a spacer, such as an architectural detail or scalable element that may be expanded or shrunk to fill the gap remaining along the spline. In this manner, the tileable building segments need not be stretched or scaled and can maintain their realistic appearance. After populating the segments along the splines, the space between the splines (that form a frame around the edge of the building) may be filled using building segments annotated to be placed on a face of a building and to be tileable across the center surface of the building side. The selection of the building segments for placement at blocks 818 and 820 can be based on the annotations applied to the building segments, and additional architectural features, such as awnings, flagpoles, mailboxes, etc. may be attached to the building segments according to applicable rules for attachments. After generating the building, the virtual building is provided to a simulated environment at block 822 for use in the simulated environment as described herein.

FIG. 9 is a block diagram illustrating an example system 900 for procedurally generating a simulated environment. In at least one example, a vehicle 902 can include one or more vehicle computing devices 904, one or more sensor systems 906, one or more emitters 908, one or more communication connections 910, at least one direct connection 912, and one or more drive systems 914. For the purpose of illustration, the vehicle 902 can be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such an example, since the vehicle 902 can be configured to control all functions from start to stop, including all parking functions, it can be unoccupied. This is merely an example, and the systems and methods described herein can be incorporated into any ground-borne, airborne, or waterborne vehicle, including those ranging from vehicles that need to be manually controlled by a driver at all times, to those that are partially or fully autonomously controlled. That is, in the illustrated example, the vehicle 902 is an autonomous vehicle; however, the vehicle 902 could be any other type of vehicle.

In at least one example, the vehicle 902 can be a data collection device (e.g., of the data collection device(s) 102). In an additional or alternative example, the one or more components of the AI stack described above can be associated with the vehicle 902. That is, the simulated environment described herein can be used to train, test, and/or validate one or more of the components described below with reference to vehicle 902.

The vehicle computing device(s) 904 can include processor(s) 916 and memory 918 communicatively coupled with the processor(s) 916. In the illustrated example, the memory 918 of the vehicle computing device(s) 904 stores a localization system 920, a perception system 922, a prediction system 924, a planning system 926, and one or more system controllers 928. Additionally, the memory 918 can include a storage (not shown), which can store map(s), model(s), etc. A map can be any number of data structures modeled in two dimensions, three dimensions, or N dimensions that are capable of providing information about an environment, such as, but not limited to, topologies (such as intersections), streets, mountain ranges, roads, terrain, and the environment in general. Maps can be associated with real environments or simulated environments. Model(s) can include machine-trained models, as described below.

In at least one example, the localization system 920 can determine a pose (e.g., a position and an orientation) of the vehicle 902 in relation to a local and/or global map based at least in part on sensor data received from the sensor system(s) 906 and/or map data associated with a map (e.g., of the map(s)). In at least one example, the localization system 920 can include, or be associated with a calibration system that is capable of performing operations for calibrating (determining various intrinsic and extrinsic parameters associated with any one or more of the sensor system(s) 906), localizing, and mapping substantially simultaneously. Additional details associated with such a system are described in U.S. patent application Ser. No. 15/675,487, filed on Aug. 11, 2017, which is related to U.S. patent application Ser. No. 15/674,853, filed on Aug. 11, 2017, the entire contents of both of which are incorporated by reference herein. As described above, the localization system 920 can output road network data and/or a road mesh based on the sensor data received by the sensor system(s) 906.

In at least one example, the perception system 922 can perform object detection, segmentation, and/or classification based at least in part on sensor data received from the sensor system(s) 906. In at least one example, the perception system 922 can receive raw sensor data (e.g., from the sensor system(s) 906). In other examples, the perception system 922 can receive processed sensor data (e.g., from the sensor system(s) 906). For instance, in at least one example, the perception system 922 can receive data from a vision system that receives and processes camera data (e.g., images). In at least one example, the vision system can utilize one or more image processing algorithms to perform object detection, segmentation, and/or classification with respect to object(s) identified in an image. In some examples, the vision system can associate a bounding box (or other semantic information, such as an instance segmentation) with an identified object and can associate a confidence score associated with a classification of the identified object. In some examples, objects, when rendered via a display, can be colored based on their perceived class. In at least other examples, similar processes (detection, classification, segmentation, etc.) may be performed by the perception system 922 for one or more other modalities (e.g., LIDAR, RADAR, ToF sensors, etc.).

The prediction system 924 can access sensor data from the sensor system(s) 906, map data associated with a map (e.g., of the map(s) which can be in the storage), and/or perception data output from the perception system 922 (e.g., processed sensor data), and can output predictions associated with one or more objects within the environment of the vehicle 902. In at least one example, the planning system 926 can determine routes and/or trajectories to use to control the vehicle 902 based at least in part on sensor data received from the sensor system(s) 906 and/or any determinations made by the perception system 922. Additional details of localizer systems, perception systems, prediction systems, and/or planning systems that are usable can be found in U.S. Pat. No. 9,612,123, issued on Apr. 4, 2017, and U.S. patent application Ser. No. 15/632,208, filed Jun. 23, 2017, the entire contents of both of which are incorporated by reference herein. In some examples (e.g., where the vehicle 902 is not an autonomous vehicle), one or more of the aforementioned systems and/or components can be omitted from the vehicle 902. While the systems described above are illustrated as "onboard" the vehicle 902, in other implementations, the systems can be remotely located and/or accessible to the vehicle 902.

In at least one example, the localization system 920, the perception system 922, the prediction system 924, and/or the planning system 926 can process sensor data, as described above, and can send their respective outputs over network(s) 930, to computing device(s) 932. In at least one example, the localization system 920, the perception system 922, the prediction system 924, and/or the planning system 926 can send their respective outputs to the computing device(s) 932 at a particular frequency, after a lapse of a predetermined period of time, in near real-time, etc.

In at least one example, the vehicle computing device(s) 904 can include one or more system controllers 928, which can be configured to control steering, propulsion, braking, safety, emitters, communication, and other systems of the vehicle 902. These system controller(s) 928 can communicate with and/or control corresponding systems of the drive system(s) 914 and/or other components of the vehicle 902.

In at least one example, the sensor system(s) 906, which can correspond to sensor system(s) 104, can include LIDAR sensors, RADAR sensors, ToF sensors, ultrasonic transducers, SONAR sensors, location sensors (e.g., GPS, compass, etc.), inertial sensors (e.g., inertial measurement units, accelerometers, magnetometers, gyroscopes, etc.), cameras (e.g., RGB, IR, intensity, depth, etc.), microphones, wheel encoders, environment sensors (e.g., temperature sensors, humidity sensors, light sensors, pressure sensors, etc.), etc. The sensor system(s) 906 can include multiple instances of each of these or other types of sensors. For instance, the LIDAR sensors can include individual LIDAR sensors located at the corners, front, back, sides, and/or top of the vehicle 902. As another example, the camera sensors can include multiple cameras disposed at various locations about the exterior and/or interior of the vehicle 902. The sensor system(s) 906 can provide input to the vehicle computing device(s) 904. In some examples, the sensor system(s) 906 can preprocess at least some of the sensor data prior to sending the sensor data to the vehicle computing device(s) 904. In at least one example, the sensor system(s) 906 can send sensor data, via the network(s) 930, to the computing device(s) 932 at a particular frequency, after a lapse of a predetermined period of time, in near real-time, etc.

The vehicle 902 can also include one or more emitters 908 for emitting light and/or sound, as described above. The emitter(s) 908 in this example include interior audio and visual emitters to communicate with passengers of the vehicle 902. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 908 in this example also include exterior emitters. By way of example and not limitation, the exterior emitters in this example include light emitters (e.g., indicator lights, signs, light arrays, etc.) to visually communicate with pedestrians, other drivers, other nearby vehicles, etc., one or more audio emitters (e.g., speakers, speaker arrays, horns, etc.) to audibly communicate with pedestrians, other drivers, other nearby vehicles, etc., etc. In at least one example, the emitter(s) 908 can be disposed at various locations about the exterior and/or interior of the vehicle 902.

The vehicle 902 can also include communication connection(s) 910 that enable communication between the vehicle 902 and other local or remote computing device(s). For instance, the communication connection(s) 910 can facilitate communication with other local computing device(s) on the vehicle 902 and/or the drive system(s) 914. Also, the communication connection(s) 910 can allow the vehicle to communicate with other nearby computing device(s) (e.g., other nearby vehicles, traffic signals, etc.). The communications connection(s) 910 also enable the vehicle 902 to communicate with a remote teleoperations computing device or other remote services.

The communications connection(s) 910 can include physical and/or logical interfaces for connecting the vehicle computing device(s) 904 to another computing device or a network, such as network(s) 930. For example, the communications connection(s) 910 can enable Wi-Fi-based communication such as via frequencies defined by the IEEE 802.11 standards, short range wireless frequencies such as BLUETOOTH®, or any suitable wired or wireless communications protocol that enables the respective computing device to interface with the other computing device(s).

The direct connection 912 can directly connect the drive system(s) 914 and other components of the vehicle 902.

In at least one example, the vehicle 902 can include drive system(s) 914. In some examples, the vehicle 902 can have a single drive system 914. In at least one example, if the vehicle 902 has multiple drive systems 914, individual drive systems 914 can be positioned on opposite ends of the vehicle 902 (e.g., the front and the rear, etc.). In at least one example, the drive system(s) 914 can include sensor system(s) to detect conditions of the drive system(s) 914 and/or the surroundings of the vehicle 902. By way of example and not limitation, the sensor system(s) can include wheel encoder(s) (e.g., rotary encoders) to sense rotation of the wheels of the drive module, inertial sensors (e.g., inertial measurement units, accelerometers, gyroscopes, magnetometers, etc.) to measure position and acceleration of the drive module, cameras or other image sensors, ultrasonic sensors to acoustically detect objects in the surroundings of the drive module, LIDAR sensors, RADAR sensors, etc. Some sensors, such as the wheel encoder(s), can be unique to the drive system(s) 914. In some cases, the sensor system(s) on the drive system(s) 914 can overlap or supplement corresponding systems of the vehicle 902 (e.g., sensor system(s) 906).

The drive system(s) 914 can include many of the vehicle systems, including a high voltage battery, a motor to propel the vehicle 902, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 914 can include a drive module controller which can receive and preprocess data from the sensor system(s) and to control operation of the various vehicle systems. In some examples, the drive module controller can include processor(s) and memory communicatively coupled with the processor(s). The memory can store one or more modules to perform various functionalities of the drive system(s) 914. Furthermore, the drive system(s) 914 also include communication connection(s) that enable communication by the respective drive module with other local or remote computing device(s).

In some examples, the vehicle computing device(s) 904, sensor system(s) 906, emitter(s) 908, and the communication connection(s) 910 can be implemented outside of an actual vehicle, for instance, as a simulated vehicle or as simulated systems, for use in "traversing" a simulated environment. That is, the vehicle computing device(s) 904, sensor system(s) 906, emitter(s) 908, and the communication connection(s) 910 can be used as a simulated autonomous vehicle for simulation purposes as described above.

As described above, the vehicle 902 can send sensor data to the computing device(s) 932, via the network(s) 930. That is, in some examples, the vehicle 902 can be a data collection device 102 as described above with reference to FIG. 1. For the purpose of this discussion, the computing device(s) described above with reference to FIG. 1 can refer to the vehicle computing device(s) 904 and/or the computing device(s) 932. In some examples, the vehicle 902 can send raw sensor data to the computing device(s) 932. In other examples, the vehicle 902 can send processed sensor data and/or representations of sensor data to the computing device(s) 932 (e.g., data output from the localization system 920, the perception system 922, the prediction system 924, and/or the planning system 926). In some examples, the vehicle 902 can send sensor data to the computing device(s) 932 at a particular frequency, after a lapse of a predetermined period of time, in near real-time, etc.

The computing device(s) 932 can receive the sensor data (raw or processed) from the vehicle 902 and/or one or more data collection devices 936 (which can include other vehicles like vehicle 902), as well as data from one or more third-party sources and/or systems 938. In at least one example, the computing device(s) 932 can include processor(s) 934 and memory 940 communicatively coupled with the processor(s) 934. In the illustrated example, the memory 940 of the computing device(s) 932 stores a procedural generation tool 702, as shown and described with respect to FIG. 7 herein, and a database of model(s) 942. In some examples, one or more of the systems and/or storage repositories can be associated with the vehicle 902 instead of, or in addition to, being associated with the memory 940 of the computing device(s) 932. The computing device 932 may be configured to provide a simulated environment from the procedural generation tool 702 and/or models 942 to the vehicle computing device for testing of the vehicle systems within the simulated environment.

As described above, simulated environments can be useful for enhancing training, testing, and/or validating systems (e.g., one or more components of an AI stack) onboard an autonomous vehicle, such as vehicle 902. In at least one example, simulated environments can be useful for training data models where training data from real environments is insufficient (e.g., as is the case with rare objects, rare scenarios, etc.). In such examples, a resulting data model can be provisioned to, or accessible by, the vehicle 902, and the vehicle 902 can utilize the data model for classifying objects in real-time (e.g., while driving or otherwise operating in the real environment). That is, the perception system 922 can utilize the data model (trained based on simulated data associated with a simulated environment) onboard in near real-time to classify objects.

As a non-limiting example, training data from real environments is insufficient for training the vehicle 902 to recognize rare events/objects (e.g., traffic lights types that are not frequently seen). In at least one example, by comparing simulated environments with real environments, the data model can learn that particular parameters matter for training a traffic light classifier. For instance, such parameters can include bulb discoloration, shading, lens distortion, dirt on the light, a burnt-out filament, variation in brightness, bulb rotation, bulb intensity, etc. Based on identifying the parameters, the training system 346 can tune simulated environments associated with traffic lights and can train a traffic light classifier based on the tuned simulated environments. Such a classifier can be provisioned to, or accessible by, the vehicle 902, and the vehicle 902 can utilize the data model for classifying traffic lights in real-time. For instance, the perception system 922 can utilize the classifier (trained based on simulated data used to generate a simulated environment) onboard in near real-time to classify traffic lights. That is, as described above, in at least one example, a classifier can be trained on simulated data and used for evaluating real data. In some examples, the classifier can be trained on real data and validated using simulated data. In such examples, identified discrepancies can be used to improve the classifier. In at least some instances, such rare examples may be identified by training, for example, a traffic light detector based on simulated image data, running the detector on real data, and determining where detections were missed. Similarly, determining that simulated parameters are not correct may comprise training an algorithm (e.g. the same detector as above) on real data, running such a detector on simulated data, and detecting missed objects.

Furthermore, simulated environments can be useful for validating and/or updating a localization algorithm used by the localization system 920. For instance, in real environments, GPS sensors experience positional drifts and may, as a result, accumulate error. Accordingly, to validate a localization algorithm that is used for localizing the vehicle 902, the evaluating computing device(s) 932 can use a simulated environment, where the pose of the vehicle 902 is known at various times (including at all times) and evaluate the sensor data associated with a corresponding real environment to validate the localization algorithm (e.g., by relying on simulated poses as position and/or orientation ground truth). In such an example, the sensor system(s) 906 can generate sensor data associated with the simulated environment and the sensor data can be analyzed by the perception system 922. An output of the perception system 922 (e.g., associated with a position in a real environment) can be validated in view of the sensor data associated with the corresponding position in the simulated environment. That is, the sensor data associated with a position in a simulated environment can serve as the ground truth for the corresponding position in the real environment. As an example, LIDAR data recorded in association with a simulated environment (e.g., where the pose of the vehicle 902 is known) can be compared to LIDAR data recorded in association with a corresponding position in a real environment and the localization algorithm can be updated as appropriate. Furthermore, simulated environments can be useful for validating RADAR or other sensors of the sensor system(s) 906. In some examples, simulated environments can offer ground truth data for calibrating sensors (e.g., of the sensor system(s) 906). Other examples include but are not limited to validating rolling shutter in simulation, calibration (e.g., of one or more of intrinsics or extrinsics) of various sensors, and the like. As would be appreciated, the techniques described herein may be used in validation, calibration, training, etc. for various other systems, subsystems, etc.

The processor(s) 916 of the vehicle 902 and the processor(s) 934 of the computing device(s) 932 can be any suitable processor capable of executing instructions to process data and perform operations as described herein. By way of example and not limitation, the processor(s) 916 and 934 can comprise one or more Central Processing Units (CPUs), Graphics Processing Units (GPUs), or any other device or portion of a device that processes electronic data to transform that electronic data into other electronic data that can be stored in registers and/or memory. In some examples, associated circuits (e.g., ASICs, etc.), gate arrays (e.g., FPGAs, etc.), and other hardware devices can also be considered processors in so far as they are configured to implement encoded instructions.

Memory 918 and 940 are examples of non-transitory computer-readable media. Memory 918 and 940 can store an operating system and one or more software applications, instructions, programs, and/or data to implement the methods described herein and the functions attributed to the various systems. In various implementations, the memory can be implemented using any suitable memory technology, such as static random-access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

It should be noted that while FIG. 9 is illustrated as a distributed system, in alternative examples, components of the vehicle 902 can be associated with the computing device(s) 932 and/or components of the computing device(s) 932 can be associated with the vehicle 902. That is, the vehicle 902 can perform one or more of the functions associated with the computing device(s) 932, and vice versa.

EXAMPLE CLAUSES

A: A computer-implemented method, comprising: receiving a building sheet representing a three dimensional surface of a reference building, the building sheet including a building feature; dividing the building sheet into a plurality of building sections based at least in part on the building feature; determining a first rule associated with placement of building sections within virtual building representations; determining a second rule associated with assembly of building sections within virtual building representations; receiving a request to generate a virtual representation of a building, the request including a building characteristic; determining a building frame having dimensions of the virtual representation of the building based at least in part on the building characteristic; determining a subset of the plurality of building sections based on the building characteristic describing a corner building segment; selecting a first building section of the subset of the plurality of building sections to place within the building frame based on the first rule; selecting a second building section to place adjacent the first building section based on the second rule; and generating a virtual representation of a building based at least in part on placing the first building section and the second building section within the building frame.

B: The computer-implemented method of example A, further comprising generating a simulated driving environment by populating the virtual representation of the building within a virtual road network, the virtual road network based at least in part on sensor data from an autonomous vehicle.

C: The computer-implemented method of any of examples A-B, further comprising determining building dimensions for the virtual representation of the building based at least in part on a location associated with the virtual representation of the building within the virtual road network, and wherein generating the virtual representation of the building is based at least in part on the building dimensions.

D: The computer-implemented method of any of examples A-C, wherein determining the building dimensions comprises accessing stored building dimension data based on the location of the virtual representation of the building within the virtual road network.

E: The computer-implemented method of any of examples A-D, wherein determining the first rule is based at least in part on a rule being applicable to a first location in the building frame.

F: The computer-implemented method of any of examples A-E, wherein: the first rule defines a location characteristic describing locations where virtual building sections may be applied within the building frame; and the second rule defines at least one of: a tiling characteristic of the virtual building section within the virtual representation of the building; or a scaling characteristic of the virtual building section to fit within the virtual building.

G: A system comprising: at least one processor; and computer-readable instructions that, when executed by the at least one processor, cause the at least one processor to perform acts comprising: receiving a building sheet representing a three-dimensional surface of a building, the building sheet including one or more building features; dividing the building sheet into a plurality of building sections based at least in part on the building features; determining a rule associated with placement of the building sections within a virtual building representation; and receiving a request to generate a virtual representation of a building; and generating the virtual representation of the building based at least in part on the rule.

H: The system of example G, wherein the computer-readable instructions cause the at least one processor to perform additional acts comprising: generating a simulated driving environment by populating the virtual representation of the building within a virtual road network, the virtual road network based at least in part on sensor data from an autonomous vehicle.

I: The system of any of examples G-H, wherein receiving the request to generate the virtual representation of the building comprises receiving building dimensions for the virtual representation of the building from a source other than the autonomous vehicle, and wherein generating the virtual representation of the building is further based on the building dimensions.

J: The system of any of examples G-I, wherein the computer-readable instructions cause the at least one processor to perform additional acts comprising: receiving updated virtual road network data from a vehicle system describing a change to the virtual road network; and adjusting a position of the virtual representation of the building within the virtual road network data based at least in part on the change to the virtual road network.

K: The system of any of examples G-J, wherein the rule comprise a first rule that defines an attachment location in the virtual representation of the building and a second rule associated with assembly of building sections with one another within the virtual representation of the building.

L: The system of any of examples G-K, wherein determining the rule comprises, for a first building section of a plurality of building sections: determining a subset of a plurality of rules applicable to the first building section based on a type of the building section; and attaching the subset of the plurality of rules to the first building section at one or more feature locations, wherein generating the virtual representation of the building is further based on connecting feature locations of adjacent building sections based at least in part on the subset of the plurality of rules.

M: The system of any of examples G-L, wherein the rule comprises, for a first building section within the virtual representation of the building, at least one of: a tiling characteristic of the first building section; a scaling characteristic for adjusting a shape or size of the first building section to fit within the virtual building; or a location characteristic describing locations where the first building section may be applied within the virtual building.

N: The system of any of examples G-M, wherein the request to generate the virtual representation of the building comprises building dimensions accessed from a building dimension database, and wherein generating the virtual representation of the building is based at least in part on the building dimensions.

O: A non-transitory computer-readable medium storing instructions executable by a processor, wherein the instructions, when executed, cause the processor to perform operations comprising: receiving a building sheet representing a three-dimensional surface of a building, the building sheet including one or more building features; dividing the building sheet into a plurality of building sections based at least in part on the building features; determining a rule associated with placement of the building sections within virtual building representations; and receiving a request to generate a virtual representation of a building; and generating the virtual representation of the building based at least in part on the rule.

P: The non-transitory computer-readable medium of example O, wherein the instructions cause the processor to perform additional operations comprising: generating a simulated driving environment by populating the virtual representation of the building within a virtual road network, the virtual road network based at least in part on sensor data from an autonomous vehicle.

Q: The non-transitory computer-readable medium of any of examples O-P, wherein receiving the request to generate the virtual representation of the building comprises receiving building dimensions for the virtual representation of the building from a source other than the autonomous vehicle, and wherein generating the virtual representation of the building is further based on the building dimensions.

R: The non-transitory computer-readable medium of any of examples O-Q, wherein the instructions cause the processor to perform additional operations comprising: receiving updated virtual road network data from a vehicle system describing a change to the virtual road network; and adjusting a position of the virtual representation of the building within the virtual road network based at least in part on the change to the virtual road network.

S: The non-transitory computer-readable medium of any of examples O-R, wherein determining the rule comprises, for a first building section of a plurality of building sections: determining a subset of a plurality of rules applicable to the first building section based on a type of the building section; and attaching the subset of the plurality of rules to the first building section at one or more feature locations, wherein generating the virtual representation of the building is further based on connecting feature locations of adjacent building sections based at least in part on the subset of the plurality of rules.

T: The non-transitory computer-readable medium of any of examples O-S, wherein the instructions cause the processor to perform additional operations comprising: accessing building dimensions for the virtual representation of the building based at least in part on a location for the virtual representation of the building within a virtual road network, and wherein generating the virtual representation of the building is based at least in part on the building dimensions.

While the example clauses described above are described with respect to one particular implementation, it should be understood that, in the context of this document, the content of the example clauses can also be implemented via a method, device, system, computer-readable medium, and/or another implementation. Additionally, any of examples A-T may be implemented alone or in combination with any other one or more of the examples A-T.

CONCLUSION

While one or more examples of the techniques described herein have been described, various alterations, additions, permutations, and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A computer-implemented method, comprising:

receiving a building sheet representing a three dimensional surface of a reference building, the building sheet including a building feature;

dividing the building sheet into a plurality of building sections based at least in part on the building feature, wherein individual building sections of the plurality of building sections represent portions of an exterior surface of the reference building;

determining a first rule associated with placement of building sections within virtual building representations;

determining a second rule associated with assembly of building sections within virtual building representations, wherein the second rule defines at least one of:

a tiling characteristic of at least one building section of the plurality of building sections, the tiling characteristic indicating at least one of: a number of instances of the at least one building section permitted to be placed adjacent along a direction, a pattern of placement of the at least one building section relative to other building sections of the plurality of building sections, or a type of other building sections permitted to be adjacent to the at least one building section of the building sections; or a scaling characteristic, the scaling characteristic indicating, for at least one building section of the plurality of building sections, how to at least one of stretch or morph the building section in one or more of a horizontal or vertical direction;

receiving a request to generate a virtual representation of a building, the request including a building characteristic;

determining a building frame having dimensions of the virtual representation of the building based at least in part on the building characteristic, wherein the building frame comprises a three-dimensional spline defined based at least in part on the dimensions of the virtual representation;

determining, based at least in part on the spline, a subset of the plurality of building sections based on the building characteristic indicating a corner of the building frame;

selecting a first building section of the subset of the plurality of building sections to place at the corner within the building frame based on the first rule;

selecting a second building section to place adjacent the first building section based on the second rule indicating the tiling characteristic or the scaling characteristic;

generating the virtual representation of the building based at least in part on placing the first building section and the second building section within the building frame; and generating a simulated driving environment by populating the virtual representation of the building within a virtual road network, the virtual road network based at least in part on sensor data from an autonomous vehicle.

2. The computer-implemented method of claim 1, further comprising determining building dimensions for the virtual representation of the building based at least in part on a location associated with the virtual representation of the building within the virtual road network, and wherein generating the virtual representation of the building is based at least in part on the building dimensions.

3. The computer-implemented method of claim 2, wherein determining the building dimensions comprises accessing stored building dimension data based on the location of the virtual representation of the building within the virtual road network.

4. The computer-implemented method of claim 1, wherein determining the first rule is based at least in part on a rule being applicable to a first location in the building frame.

5. The computer-implemented method of claim 1, wherein:

the first rule defines a location characteristic describing locations where virtual building sections may be applied within the building frame; and the second rule defining at least one of:

the scaling characteristic indicating how to modify at least one of a shape or a size of the at least one building section to fit the virtual building section corresponding to the at least one building section within the building frame having dimensions based at least in part on the building characteristic of the virtual representation of the building; or a mixture of virtual building sections within the building frame.

6. One or more non-transitory computer-readable media storing instructions that, when executed by one or more processors, causes a system to perform operations comprising:

receiving a building sheet representing a three dimensional surface of a reference building, the building sheet including a building feature;

dividing the building sheet into a plurality of building sections based at least in part on the building feature, wherein individual building sections of the plurality of building sections represent portions of an exterior surface of the reference building;

determining a first rule associated with placement of building sections within virtual building representations;

determining a second rule associated with assembly of building sections within virtual building representations, wherein the second rule defines at least one of:

a tiling characteristic of at least one building section of the plurality of building sections, the tiling characteristic indicating at least one of: a number of instances of the at least one building section permitted to be placed adjacent along a direction, a pattern of placement of the at least one building section relative to other building sections of the plurality of building sections, or a type of other building sections permitted to be adjacent to the at least one building section of the building sections; or a scaling characteristic, the scaling characteristic indicating, for at least one building section of the plurality of building sections, how to at least one of stretch or morph the building section in one or more of a horizontal or vertical direction;

receiving a request to generate a virtual representation of a building, the request including a building characteristic;

determining a building frame having dimensions of the virtual representation of the building based at least in part on the building characteristic, wherein the building frame comprises a three-dimensional spline defined based at least in part on the dimensions of the virtual representation;

determining, based at least in part on the spline, a subset of the plurality of building sections based on the building characteristic indicating a corner of the building frame;

selecting a first building section of the subset of the plurality of building sections to place at the corner within the building frame based on the first rule;

selecting a second building section to place adjacent the first building section based on the second rule indicating the tiling characteristic or the scaling characteristic;

generating the virtual representation of the building based at least in part on placing the first building section and the second building section within the building frame; and generating a simulated driving environment by populating the virtual representation of the building within a virtual road network, the virtual road network based at least in part on sensor data from an autonomous vehicle.

7. The one or more non-transitory computer-readable media of claim 6, the operations further comprising determining building dimensions for the virtual representation of the building based at least in part on a location associated with the virtual representation of the building within the virtual road network, and wherein generating the virtual representation of the building is based at least in part on the building dimensions.

8. The one or more non-transitory computer-readable media of claim 7, wherein determining the building dimensions comprises accessing stored building dimension data based on the location of the virtual representation of the building within the virtual road network.

9. The one or more non-transitory computer-readable media of claim 6, wherein determining the first rule is based at least in part on a rule being applicable to a first location in the building frame.

10. The one or more non-transitory computer-readable media of claim 6, wherein:

the first rule defines a location characteristic describing locations where virtual building sections may be applied within the building frame; and the second rule defining at least one of:

the scaling characteristic indicating how to modify at least one of a shape or a size of the at least one building section to fit the virtual building section corresponding to the at least one building section within the building frame having dimensions based at least in part on the building characteristic of the virtual representation of the building; or a mixture of virtual building sections within the building frame.

11. A system comprising:

one or more processors; and non-transitory computer-readable media storing instructions that, when executed by the one or more processors, causes the system to perform operations comprising:

receiving a building sheet representing a three dimensional surface of a reference building, the building sheet including a building feature;

dividing the building sheet into a plurality of building sections based at least in part on the building feature, wherein individual building sections of the plurality of building sections represent portions of an exterior surface of the reference building;

determining a first rule associated with placement of building sections within virtual building representations;

determining a second rule associated with assembly of building sections within virtual building representations, wherein the second rule defines at least one of:

a tiling characteristic of at least one building section of the plurality of building sections, the tiling characteristic indicating at least one of: a number of instances of the at least one building section permitted to be placed adjacent along a direction, a pattern of placement of the at least one building section relative to other building sections of the plurality of building sections, or a type of other building sections permitted to be adjacent to the at least one building section of the building sections; or a scaling characteristic, the scaling characteristic indicating, for at least one building section of the plurality of building sections, how to at least one of stretch or morph the building section in one or more of a horizontal or vertical direction;

receiving a request to generate a virtual representation of a building, the request including a building characteristic;

determining a building frame having dimensions of the virtual representation of the building based at least in part on the building characteristic, wherein the building frame comprises a three-dimensional spline defined based at least in part on the dimensions of the virtual representation;

determining, based at least in part on the spline, a subset of the plurality of building sections based on the building characteristic indicating a corner of the building frame;

selecting a first building section of the subset of the plurality of building sections to place at the corner within the building frame based on the first rule;

selecting a second building section to place adjacent the first building section based on the second rule indicating the tiling characteristic or the scaling characteristic;

generating the virtual representation of the building based at least in part on placing the first building section and the second building section within the building frame; and generating a simulated driving environment by populating the virtual representation of the building within a virtual road network, the virtual road network based at least in part on sensor data from an autonomous vehicle.

12. The system of claim 11, the operations further comprising determining building dimensions for the virtual representation of the building based at least in part on a location associated with the virtual representation of the building within the virtual road network, and wherein generating the virtual representation of the building is based at least in part on the building dimensions.

13. The system of claim 12, wherein determining the building dimensions comprises accessing stored building dimension data based on the location of the virtual representation of the building within the virtual road network.

14. The system of claim 11, wherein determining the first rule is based at least in part on a rule being applicable to a first location in the building frame.

15. The system of claim 11, wherein:

the first rule defines a location characteristic describing locations where virtual building sections may be applied within the building frame; and the second rule defining at least one of:

the scaling characteristic indicating how to modify at least one of a shape or a size of the at least one building section to fit the virtual building section corresponding to the at least one building section within the building frame having dimensions based at least in part on the building characteristic of the virtual representation of the building; or a mixture of virtual building sections within the building frame.

* * * * *